(12) United States Patent
Kim et al.

(10) Patent No.: US 12,470,183 B2
(45) Date of Patent: Nov. 11, 2025

(54) POWER AMPLIFIER MODULES, SYSTEMS, AND SUBSTRATES CONTAINING FIELD TRAPPER STRUCTURES

(71) Applicant: NXP USA, Inc., Austin, TX (US)

(72) Inventors: Kevin Kim, Chandler, AZ (US); Vikas Shilimkar, Chandler, AZ (US); Lakshminarayan Viswanathan, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 913 days.

(21) Appl. No.: 17/694,142

(22) Filed: Mar. 14, 2022

(65) Prior Publication Data

US 2023/0291369 A1 Sep. 14, 2023

(51) Int. Cl.
*H01L 23/66* (2006.01)
*H03F 3/195* (2006.01)
*H03F 3/24* (2006.01)

(52) U.S. Cl.
CPC ............ *H03F 3/245* (2013.01); *H01L 23/66* (2013.01); *H03F 3/195* (2013.01); *H01L 2223/6611* (2013.01); *H01L 2223/6616* (2013.01); *H01L 2223/6655* (2013.01); *H03F 2200/451* (2013.01)

(58) Field of Classification Search
CPC .......... H01L 23/49833; H01L 21/4853; H01L 23/13; H01L 23/3128; H01L 23/49816; H01L 24/32; H01L 24/33; H01L 24/48; H01L 24/73; H01L 2224/3201; H01L 2224/32058; H01L 2224/32225; H01L 2224/3303; H01L 2224/33055; H01L 2224/4824; H01L 2224/48464; H01L 2224/73215; H01L 2924/15151; H01L 2924/15311; H01L 2924/182; H01L 21/56;
(Continued)

(56) References Cited

U.S. PATENT DOCUMENTS 9,673,162 B2 6/2017 Viswanathan et al.
9,899,292 B2 2/2018 Chiu et al.
9,986,646 B2 5/2018 Viswanathan et al.
(Continued)

OTHER PUBLICATIONS

L. Lin, G. Cheng, W. Yin and L. Zhou, "Shielding cover effects on the RF performance of LDMOSFET power amplifier for WCDMA application," 2013 Asia-Pacific Microwave Conference Proceedings (APMC), Seoul, Korea (South), 2013, pp. 609-611.
(Continued)

*Primary Examiner* — Elias Ullah

(57) ABSTRACT

Power amplifier systems including field trapper structures are disclosed. In embodiments, the power amplifier system includes a printed circuit board (PCB), a power amplifier module (PAM), and a field trapper structure. The PAM includes, in turn, a topside radio frequency (RF) input terminal, topside RF output terminal, a PAM topside surface on which the topside RF input terminal and the topside RF output terminal are located. The PAM is mounted to the PCB in an inverted orientation such that the PAM topside surface is positioned adjacent and faces a module mount region provided on a frontside of the PCB. The field trapper structure includes a first field trapper patch, which extends parallel to the PCB frontside, is composed of an electrically-conductive material, and is located within or adjacent the module mount region in the thickness direction.

18 Claims, 8 Drawing Sheets

(58) Field of Classification Search
CPC ......... H01L 24/92; H01L 21/50; H01L 22/32; H01L 23/481
See application file for complete search history.

(56) References Cited

U.S. PATENT DOCUMENTS

| | | |
|---|---|---|
| 10,431,511 B2 | 10/2019 | Kim et al. |
| 2004/0012442 A1* | 1/2004 | Ichitsubo ................ H01L 23/66 330/129 |
| 2018/0174940 A1* | 6/2018 | Ferguson .............. H01L 23/345 |
| 2021/0328552 A1 | 10/2021 | Tucker et al. |

OTHER PUBLICATIONS

L. Lin, L. Zhou, B. Zhang, G. Wu, W. Yin and J. Mao, "Some improvements in the design of LDMOSFET power amplifier for effectively suppressing metallic shielding cover (MSC) effects," 2016 IEEE MTT-S International Wireless Symp.
European Patent Application No. 22305054.3 filed on Jan. 19, 2022.

\* cited by examiner

POWER AMPLIFIER MODULES, SYSTEMS, AND SUBSTRATES CONTAINING FIELD TRAPPER STRUCTURES

TECHNICAL FIELD

Embodiments of the present disclosure relate generally to microelectronics and, more particularly, to power amplifier modules, power amplifier systems, and system-level substrates containing field trapper structures.

BACKGROUND

A power amplifier module (PAM) contains at least one semiconductor die bearing a transistor integrated circuit, which is utilized for radio frequency (RF) signal or power amplification purposes. In the case of a Doherty PAM, for example, at least one carrier RF power die and at least one peaking RF power die are contained within the body of the PAM. The PAM may be mounted to a system-level substrate, such as a motherboard or another printed circuit board (PCB), containing or supporting other circuit elements included in a larger power amplifier circuit. Advancements in PAM performance and PAM size reductions have been achieved through various innovations, including through the development of multistage power amplifiers and die technologies having relatively high power densities, such as gallium nitride and other layered die substrates. However, many PAMs, and power amplifier systems generally, remain undesirably vulnerable to stability issues and undesired electromagnetic coupling or cross-talk, particularly as PAMs grow smaller in size and increasingly power dense. An ongoing demand thus persists for advancements enabling further optimization of electrical performance characteristics of a given PAM, while also promoting module miniaturization, supporting efficient heat dissipation, and providing other benefits.

BRIEF DESCRIPTION OF THE DRAWINGS

At least one example of the present invention will hereinafter be described in conjunction with the following figures, wherein like numerals denote like elements, and.

Figure 1:
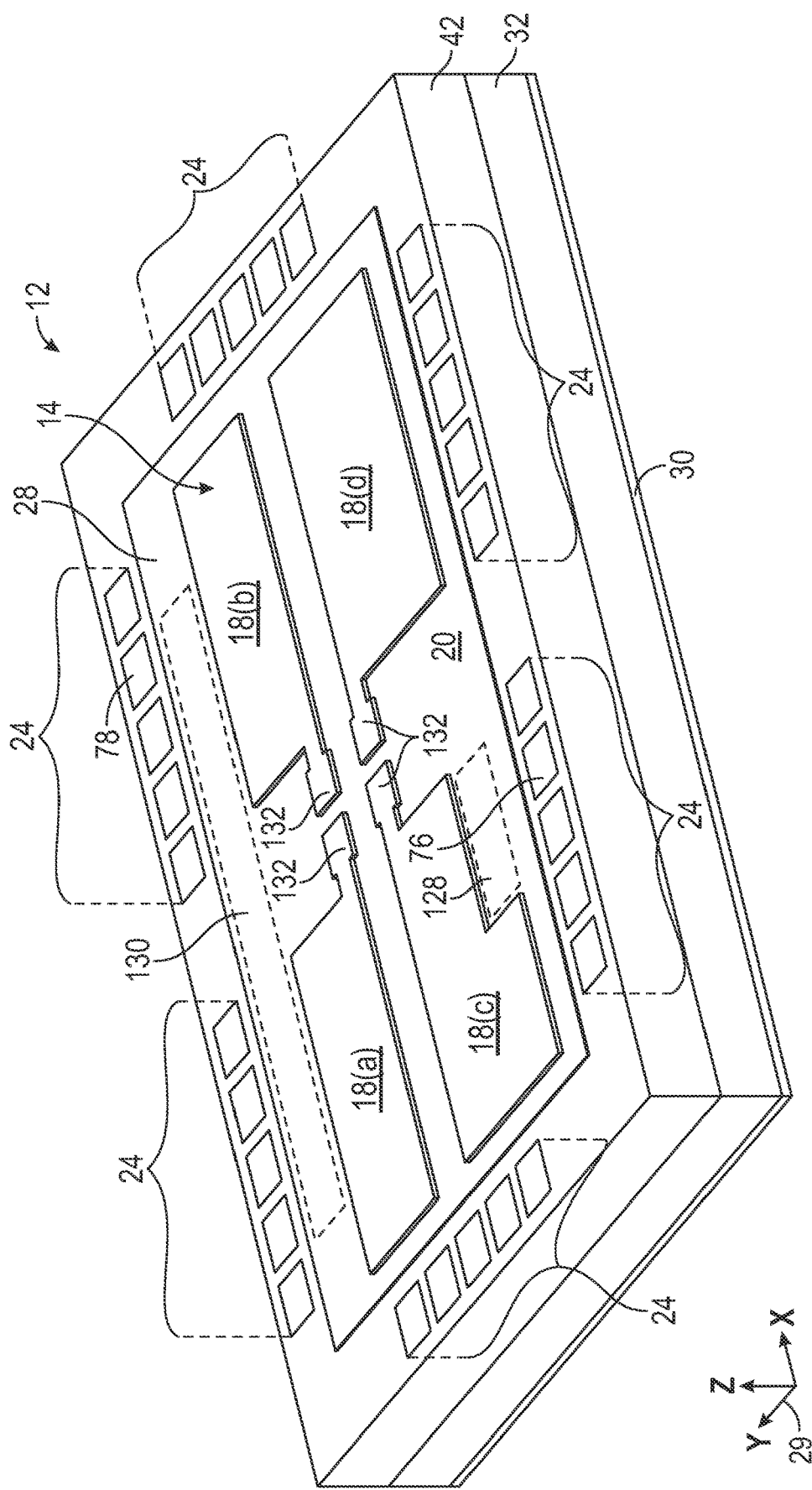
FIGS. 1 and 2 are top and bottom isometric views, respectively, of an example power amplifier module (PAM) including a field trapper structure and having a high thermal performance (HTP) architecture, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

As appearing throughout this document, the term "module" encompasses the term "package." By extension, the term "power amplifier module" encompasses the term "power amplifier package." The term "integrated circuit die" or "IC die," as further appearing herein, encompasses integrated passive devices, metal-oxide-semiconductor capacitor devices, and other such circuit elements, which are formed on discrete, semiconductor material-containing dies; as well as semiconductor material-containing dies containing more complex active integrated circuits, such as transistor amplifier circuits of the type described below. As also appearing herein, the term "printed circuit board" generally encompasses any substrate including electrical routing features and supporting one or more microelectronic components, such as IC dies; while the term "system-level printed circuit board" refers to a printed circuit board (PCB) having at least one module mount region to which a power amplifier module (PAM) may be attached. Finally, the term "electrically-conductive material," as appearing herein, refers to a material having an electrical conductivity exceeding 2.5 e7 siemens per meter (S/m) at 20 degrees Celsius, while the term "metallic material" refers to a material predominantly composed of one or more metals by weight and potentially containing lesser amounts of metallic or non-metallic constituents.

Overview

The following describes components contained in power amplifier systems, such as system-level PCBs and PAMs, produced to include unique field trapper structures. Such field trapper structures reduce undesired electromagnetic (EM) interactions or crosstalk within the power amplifier system at targeted locations, such as across the juncture or between a PAM and a supportive system-level PCB. The provision of such a field trapper structure may consequently render radiofrequency (RF) circuit performance increasingly consistent across disparate applications or usages by, for example, alleviating the effects of impedance scattering, drift, and similar EM interactions between radiative circuit elements within a PAM and the system-level PCB to which the PAM is mounted. Additionally, in embodiments, the field trapper structure may provide shielding between electrically-conductive structures contained within a PAM and/or within a system-level PCB to minimize input-output coupling within the power amplifier system. Embodiments of the field trapper structure may be implemented with little, if any impact on PAM performance and manufacturing cost increase, particularly when implemented on a system-level PCB. Finally, as a further advantage, embodiments of the present disclosure are well-suited for usage in conjunction with PAMs having high thermal performance or "HTP" architectures; that is, an architecture in which the input/output (I/O) interface of a given PAM is provided along the PAM topside surface, while a heat extraction interface (e.g., one or more metallic surfaces having low thermal resistance coupling(s) to power amplifier dies within the PAM) is availed along the opposing, backside surface of the PAM to boost the thermal dissipation capabilities of the PAM.

Depending upon the particular manner in which the power amplifier system is implemented, one or more field trapper structures may be integrated into a system-level PCB, into a PAM mounted to the system-level PCB, into an intervening structure positioned between a PAM and the system-level PCB, or into any combination thereof. In each instance, the field trapper structure is fabricated to include at least one plate-like region or feature, which is composed of an electrically-conductive material and which is referred to herein as a "field trapper patch." Often, a field trapper structure will include multiple field trapper patches distributed in an optimized spatial configuration, such as a multi-row grid layout, extending along a common plane. When so distributed, the field trapper patches are collectively referred to as a "field trapper patch array." For example, in realizations in which the field trapper structure is integrated into a system-level PCB, the field trapper patch (FTP) array may be formed in the uppermost patterned metal layer of a system-level PCB and distributed to occupy a central portion of the PCB area covered by the PAM (herein, the "module mount region"). In other instances, the FTP array may be buried within the system-level PCB at a location beneath the module mount region when, for example, the FTP array is formed in an internal metal layer of the PCB. In still other embodiments, the field trapper structure may include several field trapper patches distributed along multiple vertically-spaced planes to yield a three dimensional (3D) FTP structure or array when, for example, the field trapper patches are formed in multiple internal metal layers of the PCB. Alternatively, the FTP array may be integrated into the PAM itself and bonded to, embedded within, or buried beneath the topside surface of the PAM. As a result, in implementations in which the PAM is imparted with an HTP architecture or is otherwise mounted to the system-level PCB in an inverted orientation, the FTP array is positioned vertically adjacent the module mount region of the PCB to provide the desired shielding or field trapping function.

In embodiments, any number of the field trapper patches within the FTP array may be left electrically floating and lack electrical connections to other electrically-active elements within the system-level PCB or PAM. In other instances, most, if not all of the field trapper patches of the FTP array may be terminated by coupling to a ground plane layer contained within the system-level PCB or PAM. In this latter case, termination circuitry may further be provided to aid in dissipating EM energy, which collects onto the field trapper patches during operation of the power amplifier system. Such termination circuitry can include, for example, any combination of resistors, capacitors, or inductors electrically coupled between the field trapper patches and a ground plane layer within the PCB or system-level PCB. Regardless of whether the field trapper patches of the FTP array are individually terminated, the spacing, dimensions, and composition of the field trapper patches may be tailored to optimize the shielding characteristics of the field trapper structure in view of the internal circuitry layout or architecture of the PAM, the operational frequency range of the PAM, and other structural characteristics of the PAM or system-level PCB under consideration. For example, a given field trapper patch may be sized and shaped to underlie (extend beneath) targeted radiative elements contained within the PAM, such as wire bonds, surface mount devices (SMDs), or other radiative elements of the PAM. Concurrently, the field trapper patches may be patterned to include openings, such as non-metallized regions, at locations underlying other circuit elements potentially negatively impacted by EM coupling with the field trapper patches absent an adequate spatial standoff. Such circuit elements can include, for example, electrically-active components included in a sensitive RF network contained within the PAM, such as transmission lines, wire bonds, SMDs, or similar elements included in any impedance matching networks within the PAM, as discussed below.

An example power amplifier system including a PAM, a system-level PCB to which the PAM is mounted in an inverted orientation, and a field trapper structure integrated into the PAM are described below in connection with FIGS. 1-6. Following this, additional examples PAMs including field trapper patches of varying dispositions and planforms shapes are described in connection with FIGS. 7 and 8. Finally, an example power amplifier system including a PAM, a system-level PCB to which the PAM is mounted in an inverted orientation, and a field trapper structure integrated into the PCB are described below in connection with FIGS. 9 and 10. While described below in connection with an example PAM having a HTP architecture and a quad flat no-lead (QFN) or land grid array (LGA) formfactor, alternative embodiments of the presently-disclosed PAMs may be fabricated to possess non-HTP architectures and a wide range of formfactors, including other flat no-lead (e.g., dual flat no-lead (DFN)), ball grid array (BGA), and fan-out wafer level formfactors. Such PAMs may contain interconnections formed by wire bonds or, perhaps, may lack wire bonds in favor of other electrically-conductive interconnect features, such as printed traces. Further, the below-described teachings are equally applicable to PAMs lacking encapsulant bodies, such as a PAMs having lidded or air cavity formfactors. For example, in the case of a PAM having an air cavity formfactor, the below-described FTP arrays may be formed in the outermost or topside wall of the lid of the PAM. The following description, then, should be understood as providing a non-limiting example context and not to unduly restrict the scope of the accompanying claims in any respect.

Figure 2:
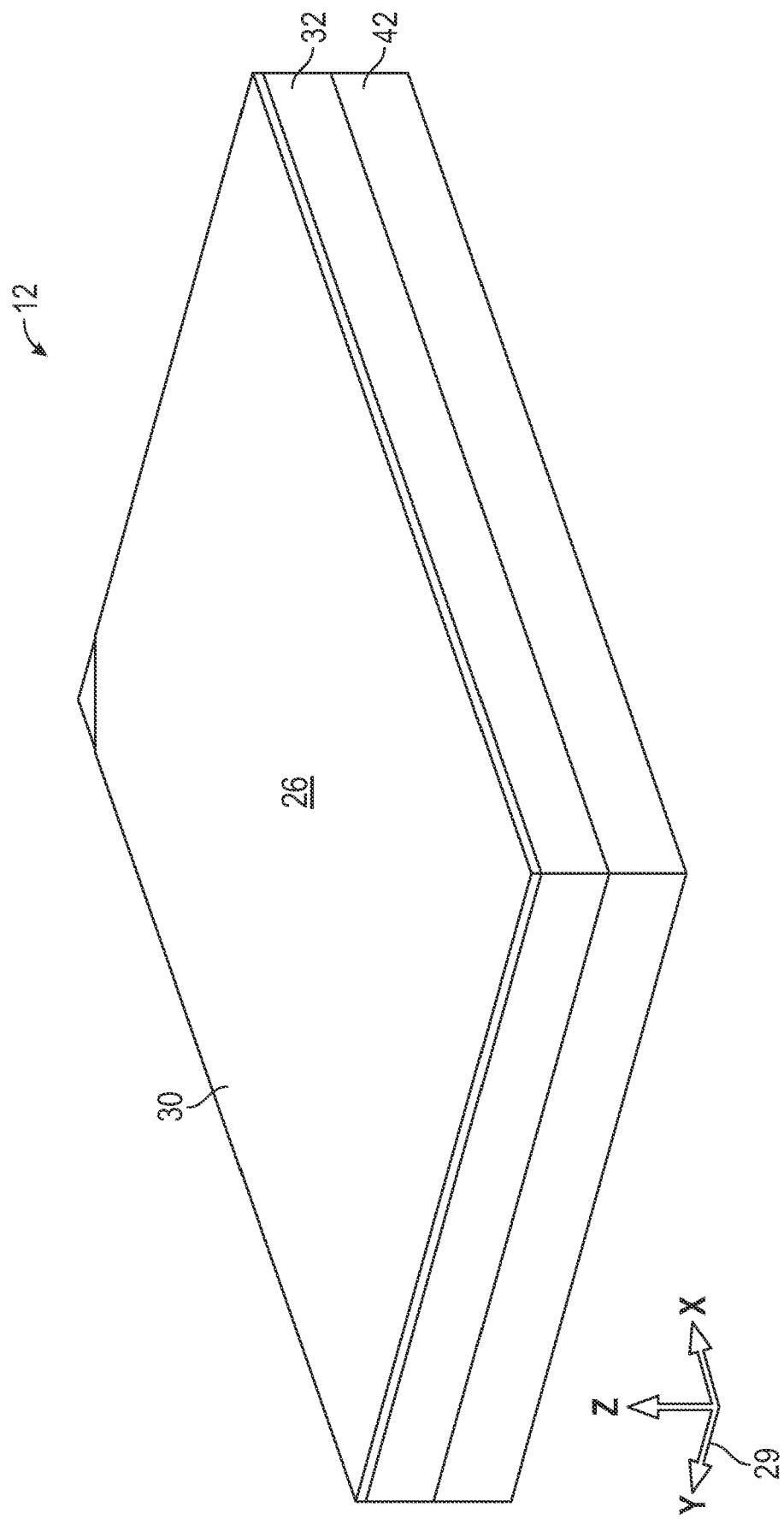
Figure 3:
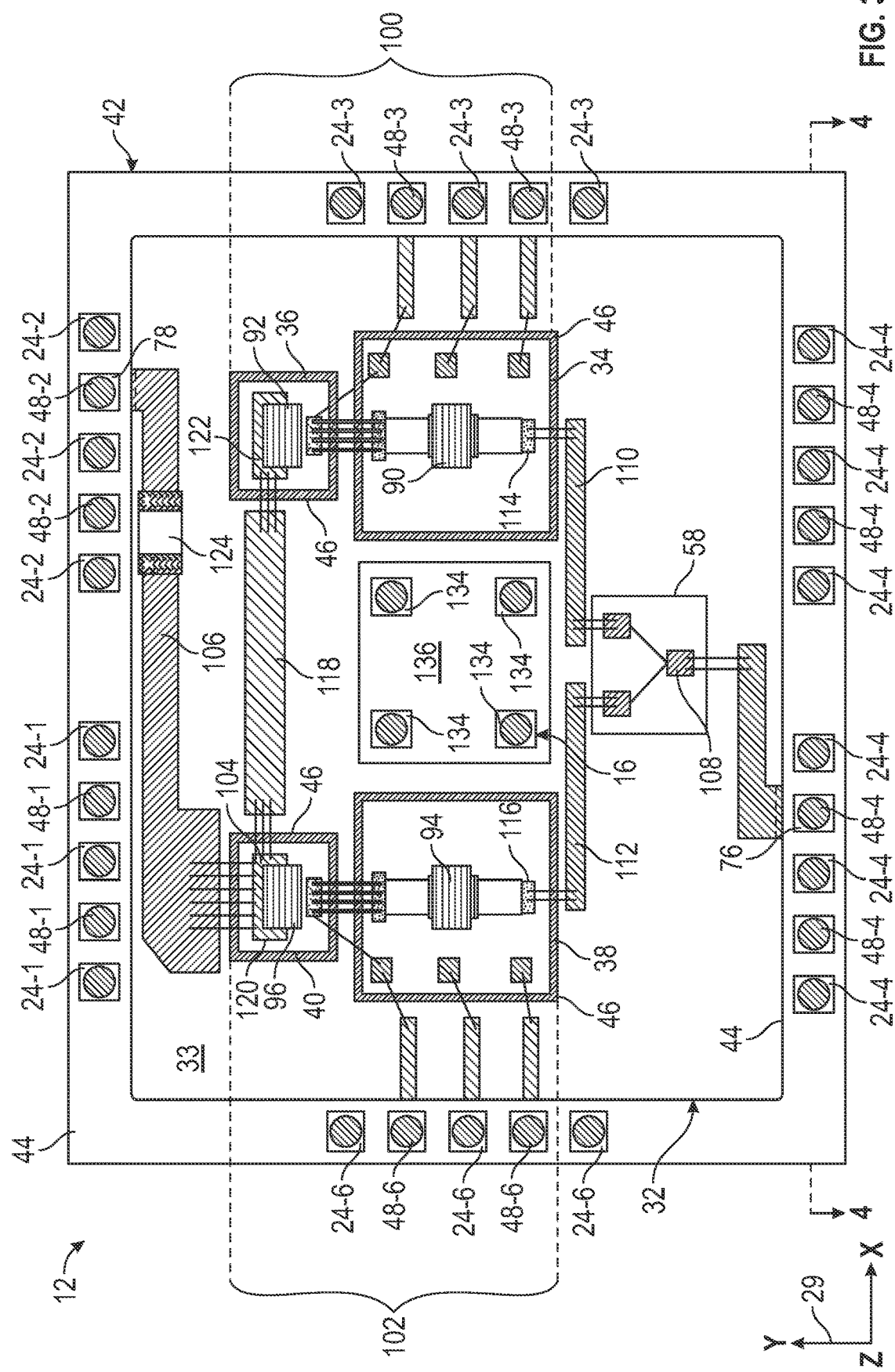
FIG. 3 is a simplified top-down or planform view of the example PAM shown in FIGS. 1 and 2, as shown in a pre-encapsulated state and with the field trapper structure partially hidden from view.

Example Power Amplifier System and Power Amplifier Module Having an Integrated Field Trapper Structure FIGS. 1 and 2 are top and bottom isometric views of a power amplifier module 12 (hereafter, "PAM 12"), respectively, which includes an integrated field trapper structure 14 and which is illustrated in accordance with an example embodiment of the present disclosure. PAM 12 is further depicted from a top-down view prior to circuitry encapsulation or overmolding in FIG. 3; while a cross-sectional view of PAM 12, as taken along line 4-4 (identified in FIG. 3), is set-forth in FIG. 4. FIG. 3, in particular, is provided to reveal various circuit elements or components suitably contained within PAM 12 in the illustrated embodiment. Such components can include a central interposer piece 16 or similar structure, which forms a portion of field trapper structure 14. In addition to interposer piece 16, field trapper structure 14 includes other circuit components in the illustrated example, including a number of field trapper plates or patches 18 collectively referred to as "field trapper patch array 18." The field trapper patches contained in field trapper patch (FTP) array 18 are spatially distributed along a topside surface 20 of PAM 12, with electrical connections between the module substrate of PAM 12 and each of the field trapper plates or patches provided through central interposer piece 16 (FIG. 3). FTP array 18 (FIG. 1), central interposer piece 16 (FIG. 3), and the other structural elements forming field trapper structure 14 are discussed more fully below, as is the functionality of field trapper structure 14 in reducing or eliminating undesired EM coupling within a power amplifier system containing PAM 12. First, however, PAM 12 is described in greater detail with FIGS. 1-4 to establish an example context in which embodiments of the present disclosure may be better understood.

Referring collectively to FIGS. 1-4, PAM 12 includes an input/output (I/O) interface defined by a number of bond-pads, contacts, or terminals 24, which are distributed along the topside surface 20 of PAM 12. Specifically, in the illustrated embodiments, topside I/O terminals 24 are distributed about an outer periphery of PAM topside surface 20 in a number of rows such that PAM 12 has a QFN or LGA-type formfactor and contains a body of encapsulant material 28 (hereafter, "overmold body 28"), which partially defines PAM topside surface 20. Overmold body 28 is deposited over circuitry contained within PAM 12 and formed form a suitable dielectric material, such as a mold compound. PAM 12 may thus be considered an overmolded, encapsulated, or "plastic" package in the illustrated embodiment. In other instances, PAM 12 may possess a different formfactor and can differ in construction to varying extents. For example, PAM 12 can be fabricated as a lidded air cavity package or module in other realizations, in which case field trapper attach array 18 may be provided on (e.g., formed on or otherwise bonded to) the exterior surface of the outer lid wall facing away from the module substrate, provided on the interior surface of the outer lid wall facing toward the module substrate, or perhaps embedded within the outer lid wall. Comparatively, in the embodiment shown in FIGS. 1-4, FTP array 18 is provided on (e.g., formed on or otherwise bonded to) the exterior surface of overmold body 28. In other instances, FTP array 18 may be embedded within overmold body 28, and perhaps buried slightly beneath the outermost surface of overmold body 28 such that array 18 is not visible from the exterior of PAM 12.

PAM 12 includes a bottomside or backside surface 26 (FIG. 2) located opposite PAM topside surface 20. Surfaces 20, 26 are opposed along the Z-axis of a coordinate legend 29 appearing in the lower left of FIGS. 1-4, which is also referred to as a "vertical," a "module thickness," or a "PCB thickness" direction herein. In the illustrated example, PAM 12 is imparted with a dual-sided HTP architecture facilitating heat extraction from the interior of PAM 12 through the backside surface thereof. Accordingly, PAM 12 is fabricated to include a topside I/O interface defined by topside bondpads or terminals 24, as well as a thermal (heat extraction) interface availed along backside surface 26 of PAM 12. The bottomside thermal interface may assume the form of one or more metallic surfaces accessible from, and perhaps coplanar with, backside surface 26 and located opposite PAM topside surface 20, as taken in a module thickness direction. In the illustrated example, backside surface 26 of PAM 12 is defined by a plated metal layer or multi-layer system 30 (herein, "backmetal layer 30"). Backmetal layer 30 serves as the thermal interface of PAM 12 and covers the backside or bottommost surface of an electrically-routed module substrate 32, such as relatively small PCB. When PAM 12 is installed within a larger microelectronic system, the outboard thermal interface of PAM 12 may further be placed in thermal communication with a heatsink (e.g., a metal chassis or fin array similar to heatsink 292 shown in FIG. 10) contained in a power amplifier system to promote conductive heat extraction from the interior of PAM 12 and dissipation by convective transfer to the surrounding ambient environment. In other embodiments, PAM 12 may be fabricated utilizing another, non-PCB module substrate, such as a leadframe-based substrate.

In the illustrated example, module substrate 32 assumes the form of a multilayer PCB. In other instances, module substrate 32 can assume other forms, whether containing or lacking electrical-routing features (e.g., copper (Cu) traces), including that of a leadframe-based substrate. As shown in FIG. 3, module substrate 32 has a populated frontside or die support surface 33 to which a number of microelectronic components, including several power transistor or amplifier dies 34, 36, 38, 40, are mounted. To establish electrical connections between dies 34, 36, 38, 40 and the other circuit components contained within PAM 12, a plurality of column-like electrical connections extend from contacts or bondpads provided on frontside surface 33 of module substrate 32 to bondpads or terminals 24 exposed along topside surface 20 of PAM 12, forming the topside surface I/O interface of PAM 12. Such column-like electrical connections (also referred to as "vertical electrical connections") can be provided in other manners, including by positioning and bonding in place discrete electrically-conductive (e.g., metallic) rod-like pieces or blocks; with such discrete electrically-conductive pieces also considered "interposer pieces" in the present context. For process efficiency, such vertical electrical connections are conveniently provided in the form of one or more interposer pieces including a dielectric (e.g., ceramic or polymeric) body in which such vertical electrical connections are contained, whether as filled vias, plated vias, or as embedded electrically-conductive (e.g., Cu) bodies; the term "via" defined to encompass such structural elements providing electrical connections in a thickness or vertical direction (corresponding to the Z-axis of coordinate legend 29). In the illustrated example, specifically, a single interposer piece 42 having a generally rectangular ring-shaped geometry is utilized for this purpose and is referred to as "interposer ring 42." Interposer ring 42 includes a dielectric body 44, upper interposer terminals or pads 24 arranged in six rows or groupings, and filled interposer vias 48 underlying interposer pads 24.

Figure 4:
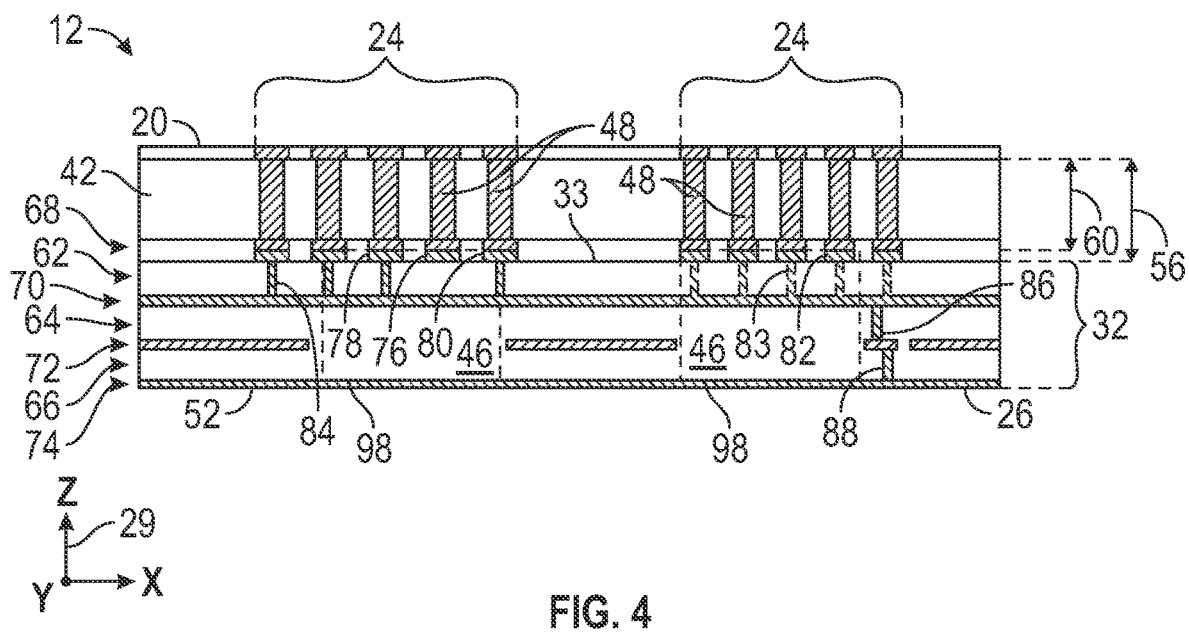
FIG. 4 is a side cross-sectional view of the example PAM shown in FIGS. 1-3, as taken along a section plane 4-4 identified in FIG. 3.
Figure 5:
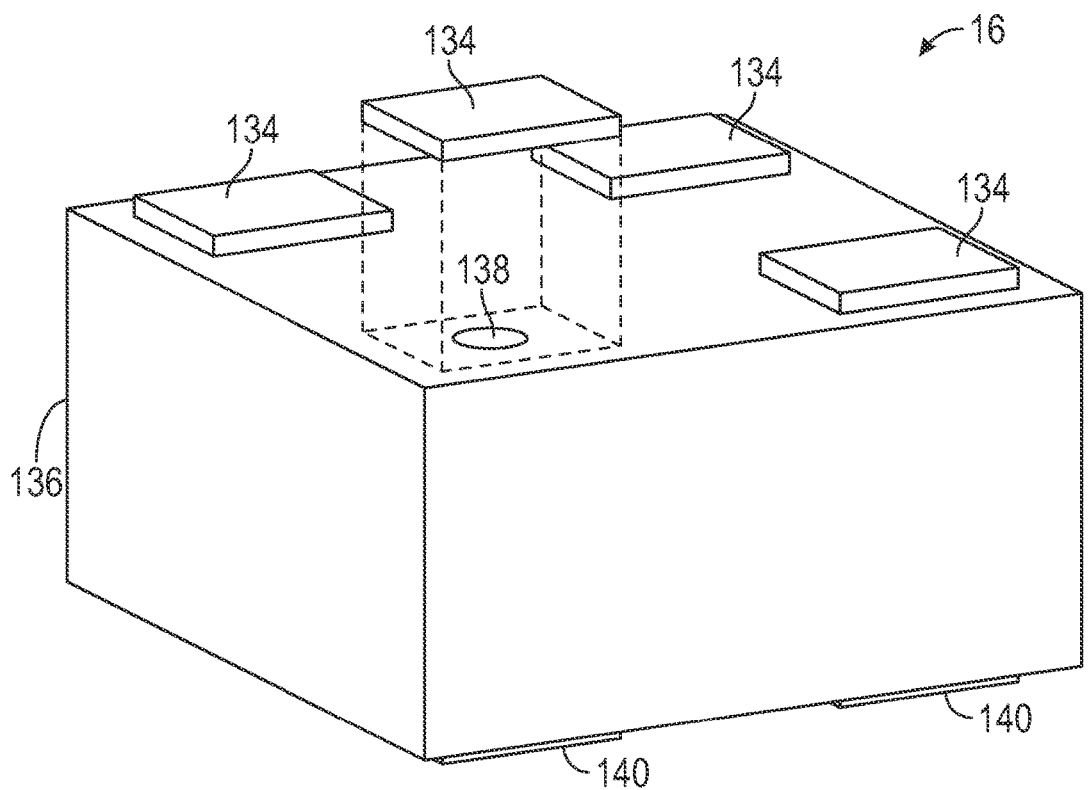
FIG. 5 is an isometric view of a central interposer piece, which is contained in the example PAM shown in FIGS. 1-4 and which may be utilized to provide electrical connection from the field trapper patch array to termination circuitry further contained within the PAM.

A plurality of microelectronic components (including power transistor dies 34, 36, 38, 40) and interposer ring 42 are mounted to populated frontside surface 33 of module substrate 32; while a dielectric encapsulant material (e.g., an epoxy glob top, a thermoset material, or another dielectric mold compound) is deposited onto populated surface 33 to form an overmold body 28. Overmold body 28 surrounds (extends over and around) the electrical components of PAM 12 and contacts the interior periphery of interposer ring 42 to define a contact surface (corresponding to topside surface 20) of PAM 12 on which the PAM I/O interface is exclusively or at least principally provided. As identified in FIG. 2, overmold body 28 may be imparted with a thickness 56 greater than the maximum height of the components (e.g., the below-described power splitter 58 and power transistor dies 34, 36, 38, 40) covered by overmold body 28 (FIG. 4). In certain embodiments, this thickness (dimension 56) is substantially equivalent to the height (dimension 60) of interposer ring 42, although this thickness may be slightly less or greater than the height of interposer ring 42 in other embodiments. Lower or proximal surfaces of interposer ring 42, and more particularly proximal ends of the terminals (e.g., vias-in-pads 24, 48) embedded within interposer ring 42, may be coupled to conductive features on populated surface 33 of module substrate 32 in embodiments.

Module substrate 32 includes several dielectric layers 62, 64, 66 (e.g., composed of FR-4, ceramic, or other PCB dielectric materials), which are disposed in an alternating or interleaved arrangement with a number of patterned metal layers 68, 70, 72. Additionally, module substrate 32 may include a bottommost metal layer 74, which may be patterned or left as a continuous layer and which may correspond to backmetal layer 30 described above. Populated surface 33 of module substrate 32 is at least partially defined by a patterned metal layer 68, while non-populated surface 52 of module substrate 32 is defined by a patterned metal layer 40 or a continuous ground plane layer. While module substrate 32 is shown to include three dielectric layers 62, 64, 66 interspersed with metal layers 68, 70, 72, 74, other embodiments of module substrate 32 may include a greater or lesser number of dielectric layers and patterned metal layers. Each of the metal layers 68, 70, 72, 74 may have a primary purpose, and also may include conductive features facilitating signal and/or voltage/ground routing between other layers. Although the description below indicates a primary purpose for each of metal layers 68, 70, 72, 74, the layers (or their functionality) may be arranged differently relative to the illustrated arrangement. For example, in alternative embodiments of module substrate 32, patterned metal layer 68 at populated surface 33 of module substrate 32 may primarily function as a signal conducting layer. In this case, patterned metal layer 68 may include a plurality of conductive features (e.g., conductive pads and traces) serving as attachment points for dies 34, 36, 38, 40 and other discrete components, as well as providing electrical connectivity between dies 34, 36, 38, 40 and the other discrete components.

In the illustrated embodiment, uppermost metal layer 68 of module substrate 32 is patterned to define a number of electrically-conductive bondpads or terminals 76, 78, 80 (identified in FIG. 4) for attachment of electrically conductive signal, bias, and/or ground terminals within interposer ring 42. In certain instances, patterned metal layer 68 may also include a plurality of "dummy" pads, such as one or more bondpads 82, to which "dummy" terminals may be attached. As appearing herein, the term "dummy terminal" refers to an interposer terminal that is not assigned any particular function in an amplifier IC or PAM and, therefore, is electrically decoupled from any active circuitry. In embodiments, the dummy terminals and dummy pads 82 may be remain electrically floating (that is, left uncoupled to ground or other circuitry); or, alternatively, may be coupled to a ground layer, such as internal ground plane layer 70, as indicated by dashed line vias 83. The conductive features of patterned metal layer 70 may be electrically coupled to conductive features of patterned metal layer 68 (a signal conducting layer) and to patterned metal layer 40 (e.g., a system ground layer) with conductive vias 84, 86, 88 extending through dielectric layers 62, 64, 66. For example, conductive ground terminal pads 78, 80 may be electrically coupled through vias 84 to patterned metal layer 70. A third patterned metal layer 72 functions to convey bias voltages to power transistors 90, 92, 94, 96 within dies 34, 36, 38, 40, and also may function as a routing layer, as mentioned above. Finally, fourth metal layer 74 functions as a system ground layer and also as a heatsink attachment layer in embodiments.

Module substrate 32 may further contain one or more thermal dissipation structures 46, which extend between surfaces 26, 50 of module substrate 32. When so provided, IC dies 34, 36, 38, 40 may be physically and electrically coupled to the uppermost surfaces of thermal dissipation structures 46 exposed at topside surface 20 of module substrate 32. Bottom surfaces 98 of thermal dissipation structures 46 may be exposed at non-populated surface 52 of module substrate 32, or bottom surfaces 98 of thermal dissipation structures 46 may be covered with bottommost metal layer 40, as shown in FIG. 4. In either instance, thermal dissipation structures 46 provide a thermal pathway between dies 34, 36, 38, 40 and bottom surfaces 98 of thermal dissipation structures 46 and, therefore, non-populated surface 52 of module substrate 32. In embodiments, thermal dissipation structures 46 may include conductive metallic coins press-fit and/or otherwise attached into through-holes extending between sides or surfaces 20, 26 of module substrate 32. In alternative embodiments, each of thermal dissipation structures 46 may include a plurality or a set of conductive thermal vias, such as circular or bar vias, extending between principal sides or surfaces 20, 26 of module substrate 32. As described in more detail below, exposed bottom surfaces 98 of thermal dissipation structures 46 (or the portion of patterned metal layer 40 overlying those surfaces 98) are physically and thermally coupled to a heatsink when PAM 12 is integrated within a larger electrical system.

The terminals or contacts included in topside I/O interface 24 of PAM 12 include an RF input terminal 76 and an RF output terminal 78 (identified in FIGS. 1 and 3). The following circuit elements or components are contained within PAM 12 and electrically coupled between terminals: (i) a power splitter 58; (ii) a two-stage, carrier amplifier section 100; (iii) a two-stage peaking amplifier section 102; (iv) a number of phase shift and impedance matching elements; (v) a combining node 104; and (vi) an output-side impedance matching network 106. Through one or more electrically-conductive structures or interconnect features (e.g., vias, traces, and/or wire bonds, as shown), RF input terminal 76 is electrically coupled to an input 108 of power splitter 58. Similarly, through one or more interconnect features (e.g., vias, traces, and/or wire bonds), RF output terminal 78 is electrically coupled to combining node 104 via output-side impedance matching network 106. Power splitter 58 is coupled to populated surface or die support surface 33 of module substrate 32 and may include one or more discrete die and/or components. As noted above, power splitter 58 includes an input terminal 108 and two output terminals (not labeled). Input terminal 108 of power splitter 58 is electrically coupled to RF input terminal 76 through one or more conductive structures (e.g., vias, traces, and/or wire bonds, as shown). The output terminals of power splitter 58 are electrically coupled through one or more conductive structures (e.g., vias, traces, and/or wire bonds) and input circuits 110, 112 to inputs 114, 116 of carrier and peaking amplifier sections 100, 102, respectively. Power splitter 58 is configured to divide the power of the input RF signal received through the RF input terminal into first and second RF signals, which are produced at the output terminals of power splitter 58. In addition, power splitter 58 may include one or more phase shift elements configured to impart a 90 degree (°) phase difference between the RF signals provided at the splitter output terminals.

The first output of power splitter 58 is electrically coupled to a carrier amplification path extending within PAM 12, while the second output of power splitter 58 is electrically coupled to a peaking amplification path within PAM 12. The RF signal produced at the second output of splitter 58 may be delayed by about 90° from the RF signal produced at the first power splitter output. Stated differently, the RF signal provided to the peaking amplification path may be delayed by about 90° from the RF signal provided to the carrier amplification path. Due to this arrangement, the first RF signal generated by power splitter 58 is amplified through the carrier amplification path, while the second RF signal produced by power splitter 58 is amplified through the peaking amplification path. In the embodiment of FIG. 1, each of the carrier and peaking amplification paths extends through a two-stage power amplifier section in which a driver-stage transistor 90, 94 is implemented on a driver-stage die 34, 38, while a final-stage transistor 92, 96 is implemented on a separate final-stage die 36, 40. For example, each of transistors 90, 92, 94, 96 may be field effect transistors (FETs), such as laterally-diffused metal oxide semiconductor (LDMOS) FETs or high electron mobility transistors (HEMTs). The description and claims may refer to each transistor as including a control terminal and two current-conducting terminals. For example, utilizing terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the embodiments are not limited to implementations the utilize FET devices, and instead are meant to apply also to implementations that utilize bipolar junction transistors (BJT) devices or other suitable types of transistors.

In the illustrated example, carrier amplifier section 100 of PAM 12 includes a silicon driver-stage die 34 and a gallium nitride (GaN) final-stage die 36; while peaking amplifier section 102 likewise includes a silicon driver-stage die 38 and a GaN final-stage die 40. In other embodiments, each of carrier and peaking amplifier sections 100, 102 may include a two-stage power amplifier implemented on a single die, or each of carrier and peaking amplifier sections 100, 102 may include a single-stage power amplifier implemented on a single die. In still other implementations, each of carrier and peaking amplifier section 100, 102 may include a two-stage power amplifier implemented on separate driver and final-stage dies, while the driver and final-stage dies may be formed utilizing the same semiconductor technology; e.g., both the driver and final-stage dies are silicon dies or GaN dies. Alternatively, as a further possibility, the driver and/or final-stage dies may be formed utilizing different semiconductor technologies than those described above; e.g., the driver and/or final-stage dies may be formed from silicon germanium (SiGe) and/or gallium arsenide (GaAs) die.

With continued reference to FIGS. 1-4, carrier amplification section 100 includes above-mentioned driver-stage die 34, final-stage die 36, and a phase shift and impedance inversion element 118. Driver-stage die 34 and final-stage die 36 of carrier amplifier section 100 may be electrically coupled in a cascade arrangement between an input terminal 114 of driver-stage die 34 (corresponding to a carrier amplifier input) and an output terminal 122 of final-stage die 36 (corresponding to a carrier amplifier output). In embodiments, the integrated circuitry of driver-stage die 34 may include a series-coupled arrangement of input terminal 114, a silicon power transistor 90, and the following non-labeled features: an input impedance matching circuit, an integrated portion of an interstage impedance matching circuit, and an output terminal. The gate of transistor 90 is electrically coupled through the input impedance matching circuit to input terminal 114, while the drain of transistor 90 is electrically coupled through the output-side impedance matching circuit to the output terminal of die 34. The source of transistor 90 is electrically coupled to a patterned metal layer (or source terminal) on a bottom surface of die 34; and the bottom patterned metal layer is physically, electrically, and thermally coupled to the exposed top surface of a thermal dissipation structure 46. The output terminal of driver-stage die 34 is electrically coupled to the input terminal of final-stage die 36 through a wire bond array or another type of electrical connection. Final-stage die 36 also includes a plurality of integrated circuits; e.g., a series-coupled arrangement of an input terminal (not numbered), a GaN power transistor 92, and an output terminal 122. The gate of transistor 92 may be electrically coupled to the input terminal of die 36, and the drain of transistor 92 is electrically coupled to output terminal 122 of die 36. The source of transistor 92 is electrically coupled to a patterned metal layer on a bottom surface of die 36; and the bottom patterned metal layer is physically, electrically, and thermally coupled to the exposed top surface of a thermal dissipation structure 46.

The peaking amplification path includes the above-mentioned driver-stage die 38 and final-stage die 40. Driver-stage die 38 and final-stage die 40 of the peaking amplification path are electrically coupled together in a cascade arrangement between an input terminal 116 of driver-stage die 38 (corresponding to a peaking amplifier input) and an output terminal 120 of final-stage die 40 (corresponding to a peaking amplifier output). Driver-stage die 38 may include a plurality of ICs. In an embodiment, the integrated circuitry of die 38 includes a series-coupled arrangement of input terminal 116, an input impedance matching circuit (not numbered), a silicon power transistor 94, an integrated portion of an interstage impedance matching circuit (not numbered), and an output terminal not numbered, in an embodiment More specifically, the gate of transistor 94 is electrically coupled through the input impedance matching circuit to input terminal 116, and the drain of transistor 94 is electrically coupled through the output-side impedance matching circuit to the output terminal of die 38. The source of transistor 94 is electrically coupled to a patterned metal layer on a bottom surface of die 38, and the bottom patterned metal layer is physically, electrically, and thermally coupled to the exposed top surface of a thermal dissipation structure 46. The output terminal of driver-stage die 38 is electrically coupled to the input terminal of final-stage die 40 through a wire bond array (not numbered) or another type of electrical connection. Final-stage die 40 also includes a plurality of integrated circuits. In an embodiment, the integrated circuitry of die 40 includes a series-coupled arrangement of an input terminal (not numbered), a GaN power transistor 96, and an output terminal 120. More specifically, the gate of transistor 96 is electrically coupled to the input terminal of die 40, and the drain of transistor 96 is electrically coupled to output terminal 120 of die 40. The source of transistor 96 is electrically coupled to a patterned metal layer on a bottom surface of die 40, and the bottom patterned metal layer is physically, electrically, and thermally coupled to the exposed top surface of a thermal dissipation structure.

To ensure proper Doherty operation, the carrier amplifier may be biased to operate in a class AB mode, and the peaking amplifier may be biased to operate in a class C mode. To accomplish this biasing, a plurality of gate and drain bias voltages may be provided by external bias voltage sources. In embodiments, the bias voltages are provided through the bias terminals and interposer ring 42. Specifically, gate bias voltages for driver-stage transistors 90, 94 may be provided through driver gate bias terminals, drain bias voltages for driver-stage transistors 90, 94 may be provided through driver drain bias terminals, and gate bias voltages for final-stage transistors 92, 96 may be provided through gate bias terminals. Each of the terminals has a proximal end coupled to conductive structures (e.g., pads and traces) of patterned metal layer 68, and the conductive structures are electrically coupled (e.g., through wire bonds, as shown) to bias pads on the driver- and final-stage dies. In the illustrated embodiment, the gate and drain bias pads for both driver- and final-stage transistors 90, 92, 94, 96 are located on driver-stage dies 34, 38, and the gate bias voltage for final-stage dies 36, 40 "hops" from driver-stage dies 34, 38 to final-stage dies 36, 40 through wire bond connections, as shown (although other connections, such as printed traces, may be utilized to form the desired electrical interconnections in alternative embodiments). Returning again to the operation of PAM 12, an amplified carrier signal is produced at output terminal 122 of final-stage die 36, and an amplified peaking signal is produced at output terminal 120 of final-stage die 40, which also functions as combining node 104 for the amplifier. According to an embodiment, output terminal 122 of carrier final-stage die 36 is electrically coupled (e.g., through wire bonds (not numbered) or another type of electrical connection) to a first end of the phase shift and impedance inversion element 118, and output terminal 120 of peaking final-stage die 40 is electrically coupled (e.g., through wire bonds or another interconnect feature) to a second end of the phase shift and impedance inversion element 118.

In embodiments, phase shift and impedance inversion element 118 may be implemented with a quarter-wavelength or lambda/4 ($\lambda$/4) or shorter transmission line (e.g., a microstrip transmission line with an electrical length up to approximately 90°) formed from a portion of patterned metal layer 68. As utilized herein, lambda denotes the wavelength of an RF signal at the fundamental frequency of operation of PAM 12; e.g., a frequency in a range of about 600 megahertz (MHz) to about 10 gigahertz (GHz) or higher. The combination of the phase shift and impedance inversion element 118 and the wire bond (or other) connections to output terminals 122, 120 of dies 36, 40 may impart about a 90° relative phase shift to the amplified carrier signal as the signal travels from output terminal 122 to output terminal 120/combining node 104. When the various phase shifts imparted separately on the carrier and peaking RF signals through the carrier and peaking paths, respectively, are substantially equal, the amplified carrier and peaking RF signals combine substantially in phase at output terminal 120/combining node 104. Output terminal 120/combining node 104 is electrically coupled (e.g., through wire bonds or another type of electrical connection) through an output-side impedance matching network 106 to the RF output terminal. As previously noted, other SMDs may also be mounted to populated frontside surface 33 of module substrate 32 to complete the circuitry of PAM 12, with an example of one such SMD 124 (e.g., a chip cap) shown in FIG. 3 as electrically coupled to output-side impedance matching network 106 along the length of its transmission line.

With continued reference to FIGS. 1-4, and discussing field trapper structure 14 in greater detail, FTP array 18 is provided along and bonded to the outermost surface of overmold body 28 located furthest module substrate 32. Any practical number of field trapper patches may be included in FTP array 18, with the field trapper patches imparted with various planform geometries or shapes. In this regard, the field trapper patches or plates within a given FTP array may be geometrically arranged or spatially distributed in 1–N rows and 1–M columns (where either N or M is greater than one), and without intervening conductive elements between the field trapper patches in the array to define electrical isolation gaps separating the field trapper plates, whether such gaps are left as unfilled air voids or filled with a dielectric PCB material. In the illustrated example, specifically, FTP array 18 includes four patches individually labeled as 18(a)-(d) and spaced in a two-by-two grid or array. In other embodiments, the field trapper patches within a given FTP array may be distributed in a different spatial arrangement. Further, as previously stated, certain embodiments of the field trapper structure may include a single field trapper plate or patch, whether such a patch is localized (e.g., positioned beneath a single EM radiative element or set of radiative elements particularly vulnerable to EM interference) or more expansive to cover a relatively large fraction of the PAM topside surface not occupied by the frontside I/O interface. The field trapper patches of example FTP array 18 each have a generally rectangular or polygonal geometry in the present example; and, collectively, cooperate to underlie or vertically overlap with a central portion of die support surface 33 to which dies 34, 36, 38, 40 are attached, as well as the wire bonds providing the desired interconnections between dies 34, 36, 38, 40 and other electrically-conductive elements within PAM 12.

Continuing the description from the foregoing paragraph, the field trapper patches within FTP array 18 may be sized, shaped, and arranged underlie or extend beneath the wire bonds providing connections to the respective inputs and outputs of driver-stage dies 34, 38, as well as the wire bonds providing connections to the respective inputs and outputs of final-stage dies 36, 40. As shown in FIG. 3, wire bonds may extend outwardly from die support surface 33 such that the wire bond apexes or peak loop heights are located relatively close to PAM topside surface 26. The wire bonds may be radiative elements, which absent the provision of field trapper structure 14, are prone to undesired EM coupling with electrically-active elements supported by or included in the system-level substrate to which PAM 12 is ultimately mounted, such as PCB 126 described below in connection with FIG. 6. Additionally or alternatively, in embodiments, the field trapper patches within FTP array 18 may be positioned and shaped to underlie (as considered when PAM 12 is in its inverted orientation) other radiative elements within PAM 12, such as discrete capacitors, discrete inductors, discrete resistors, or other SMDs bonded to die support surface 33 of module substrate 32. More generally, FTP array 18 may be patterned to provide relatively comprehensive or expansive coverage across frontside 146 of PCB 126; e.g., in embodiments, the field trapper patches included in FTP array 18 may, by surface area, occupy at least half of the central region of module mount region 150 bounded by frontside bondpad or terminals 24. Further, as FTP array 18 is distributed across a central portion of PAM topside surface 20 and flanked by the terminals or bondpads of frontside I/O interface 24, FTP array 18 and the backside thermal interface of PAM 12 (here, backmetal layer 30) may be intersected by a common axis extending in a vertical or thickness direction.

While providing relatively expansive or thorough coverage of the central portion of PAM topside surface 20, generally considered, FTP array 18 may also be patterned to avoid extension under certain circuit elements potentially negatively impacted by EM coupling with the field trapper patches within FTP array 18. Such circuit elements can include, for example, components contained in a sensitive RF network within a PAM, such as SMDs, wire bonds, RF signal-carrying transmission lines, or the like forming an input-side and/or output-side impedance matching network of PAM 12. Consider, in this regard, dashed regions or areas 128, 130 in FIG. 1. Dashed region 128 is formed as an opening (e.g., a non-metallized region) within field trapper patch 18(c), which underlies the transmission line electrically coupling RF input 78 to the input of splitter 58 shown in FIG. 3. Accordingly, a common axis extending in the thickness direction (parallel to the Z-axis of coordinate legend 29) intersects both the transmission line connected to the input of splitter 58 and the opening (region 128) formed in field trapper patch 18(c). Similarly, field trapper patches 18(a)-(b) are imparted with decreased widths relative to field trapper patches 18(c)-(d), as measured along the Y-axis of coordinate legend 29, to ensure that area 130 (FIG. 1) is not encroached by patches 18(a)-(b), with this area underlying the RF-signal carrying transmission line included in output-side impedance matching network 106 (FIG. 3). Thus, again, an axis extending in the thickness direction (parallel to the Z-axis of coordinate legend 29) intersects both the transmission line of output-side matching network 106 and the openings (region 130) formed in FTP array 18. In other implementations, the field trapper patches within FTP array 18 may be patterned to avoid extending under other types of circuit elements, such as SMDs or wire bonds, included in an impedance matching network or another sensitive RF network contained in a given PAM.

The particular shape, number, disposition, dimensions, and composition of the field trapper patches included in FTP array 18 will vary between embodiments of PAM 12. For example, the field trapper patches can be formed to possess decreasingly or increasingly complex geometric shapes relative to those shown in FIG. 1, as discussed below in connection with FIGS. 7 and 8. The respective thicknesses of the field trapper patches included in FTP array 18 will also vary among embodiments. Generally, the field trapper patches will often be imparted with substantially uniform thicknesses, as measured in a thickness direction along the Z-axis of coordinate legend 29; and, in an embodiment, may each have an average thickness ranging from about 0.7 mils to about 1.4 mils. In other implementations, the field trapper patches may be thicker or thinner than the aforementioned range; and noting that, in many instances, metal layer thickness will not be fundamental constraint or primary factor in fabricating field trapper structure 14. This stated, it may be beneficial for FTP array 18 to possess a thickness that is relatively minimal or thin (e.g., equal to or less than 1.4 mils) to provide a greater electrical resistance to induced electrical current in the plane of FTP array 18 (parallel to the X-Y plane of coordinate legend 29) aiding in the dissipation of EM energy impinging upon field trapper patches of array 18. Concurrently, the field trapper patches within FTP array 18 are beneficially imparted with a sufficient thickness (e.g., equal to or greater than about 0.7 mils) to prevent appreciable EM energy penetration and to satisfy manufacturing constraints, depending upon the manufacturing approach employed.

The field trapper patches within FTP array 18 can be fabricated from any magnetically-interactive, electrically-conductive material having suitable properties for serving as an EM shield. Candidate materials include various metallic materials, such as Cu and aluminum (Al) alloys; as well as ferromagnetic alloys containing differing quantities of iron (Fe), cobalt (Co), nickel (Ni), and combinations thereof. In certain embodiments, FTP array 18 may be composed of magnetic alloy, such as nichrome (NiCr), or another microwave-absorbing material. In still other instances, the field trapper patches within FTP array 18 may be composed of a composite material; e.g., a non-metallic carrier material or matrix filled with one or more electrically-conductive additives, such as metallic particles distributed throughout the matrix. Examples in this latter regard include epoxies filled with metallic (e.g., Cu) particles or non-metallic, electrically-conductive (e.g., graphite) particles. Electrically-conductive ceramics and similar materials may also be utilized in embodiments; noting that, to effectively provide the desired EM shielding functionality, the field trapper patches are not required to possess high electrical conductivities, but rather can be only mildly electrically conductive and lossy in nature to help dissipate EM energy collected onto to the FTP array during operation of the power amplifier system.

In the illustrated example, FTP array 18 is provided on (that is, formed on, embedded in, or otherwise bonded to) the outermost surface of overmold body 28 opposite module substrate 32 post-molding. In one approach, FTP array 18 is deposited onto the outermost surface of overmold body 28 utilizing, for example, sputter deposition of suitable metallic or microwave-absorbing material, such as NiCr or another metallic material containing non-trace amounts of nickel or chromium. In other instances, a precursor material may be initially deposited onto the outermost surface of overmold body 28 and then processed to yield FTP array 18. For example, a metal particle-containing paste can be applied onto overmold body 28 utilizing a dry state application technique (e.g., through application of a film) or a wet state application technique, such as ink jet printing, spray application, painting, squeegee application, or the like. As a specific example, a slurry or paint-like precursor material may be applied over the outer surface of overmold body 28 utilizing a squeegee in combination with a stencil to provide the desired patterning. The precursor material may then be sintered or otherwise cured to yield FTP array 18. As a still further possibility, FTP array 18 may be independently fabricated as, for example, a freestanding film or metal foil with an adhesive backing. FTP array 18 may then be adhesively applied over overmold body 28 utilizing a "peeland-stick" approach, with the adhesive backing potentially being electrically-conductive to provide electrical connections between the patches within FTP array 18 and any associated terminals or bondpads, such as the outer bondpads of central interposer piece 16 discussed below.

In certain embodiments, such as when PAM 12 is operated over a lower radiofrequency range or reduced EM shielding across the PAM-PCB interface is otherwise sufficient, most, if not all of the field trapper patches included in FTP array 18 may remain electrically floating (that is, may lack a direct electrical connection to a ground plane or other circuitry) during PAM usage. More commonly, however, some, if not all of the field trapper patches within array 18 are electrically coupled to certain termination circuitry further contained within PAM 12, which functions to dissipate EM energy collected onto the field trapper patches during operation of PAM 12 and the larger power amplifier system in which PAM 12 is deployed. In certain instances, such termination circuitry can be integrated into the system-level substrate to which PAM 12 is mounted, such as PCB 126 (described below), with suitable electrical connections formed between the field trapper patches of FTP array 18 and the bondpads connected to the termination circuitry when PAM 12 is mounted to the system-level substrate. This possibility notwithstanding, it will often be the case that such termination or EM energy dissipation circuitry is integrated into the same device or body (whether a PAM or a system-level PCB to which a PAM is mounted) as is the FTP array deployed along or adjacent the PAM-PCB interface or module mount region. Accordingly, such termination circuitry may be contained within PAM 12 in the illustrated example and as discussed more fully below in connection with FIG. 6. Further, as shown most clearly in FIG. 1, field trapper patches 18(*a*)-(*d*) may each be produced to include an extension 132 or other electrically-conductive (e.g., patterned metal) feature, which provides connection to an electrically-conductive via within the body of PAM 12. Specifically, in the case of PAM 12, patch extensions 132 provide electrical contact to outer bondpads 134 formed on the surface of central interposer piece 16 facing away from module substrate 32, with central interposer piece 16 further illustrated in isolation in FIG. 5 and discussed below.

Referring collectively to FIGS. 1-5, central interposer piece 16 is produced include a number of electrically-conductive interposer vias 138 (one of which is identified in FIG. 5) embedded within dielectric body 136 of interposer piece 16. Electrically-conductive interposer vias 138 each extend from an upper interposer pad 134 to a lower interposer pad 140 to provide electrical connections between corresponding pairs or groups of interposer pads 134, 140. In this manner, interposer vias 138 provide electrical connections from the field trapper patches within array 18 to module substrate 32, which may contain or support termination circuitry as discussed below in connection with FIG. 6. As was the case with interposer ring 42, central interposer piece 16 may be fabricated utilizing an electrically-routed substrate (e.g., a single layer or multi-layer PCB, a ceramic substrate, or another dielectric substrate making-up dielectric body 136) containing plated vias, backfilled vias, metallic coining, or other electrically-conductive features to vertically interconnect corresponding pairs of interposer pads 134, 140. For example, in embodiments in which interposer piece 16 is fabricated as a discrete PCB piece, the dielectric layers of the PCB (or other structure) may be composed from a suitable dielectric material, such as FR-4, while Cu or other features are formed on and through the dielectric layers to produce vias 138. In other implementations, central interposer piece 16 may be composed of a dielectric structure (e.g., a coreless substrate) containing metallic (e.g., Cu) coining or another conductive, which is separately fabricated and subsequently embedded in the dielectric interposer body to form one or more of the interposer vias 138. As a still further possibility, interposer piece 16 can be provided as dielectric bodies (e.g., ceramic pieces) processed to create vertical openings therethrough, which are then plated or backfilled with electrically-conductive material to produce vias 138. For example, in one approach, one or more ceramic pieces may be subject to a material removal process, such as laser drilling, to create a number of vertically-extending tunnels. The vertically-extending tunnels may then be plated with a Cu or another metallic material utilizing electroplating or electroless plating technique. Various other interposer constructions are also possible in alternative implementations.

In other implementations, field trapper patches 18 may be electrically coupled to module substrate 32 and/or circuitry within PAM 12 utilizing multiple separate and spaced interposer pieces or, perhaps, by connection to bondpads and associated vias formed in peripheral interposer ring 42. By providing connection to all of the field trapper patches included within array 18 utilizing a single, centrally-located interposer piece 16, however, a number of advantages are achieved including reductions in piece part count and manufacturing complexity. Additionally, as interposer piece 16 is located between driver-stage dies 34, 38 in the illustrated example, some degree of shielding may also be provided by interposer piece 16 between dies 34, 38 to further deter any undesired EM coupling between the carrier and peaking signal paths extending within PAM 12. Finally, in alternative realizations, one or more of field trapper patches 18 may be electrically coupled to module substrate 32 or circuitry within PAM 12 utilizing discrete, prefabricated, electrically-conductive pieces, such as metallic (e.g., Cu) columns, cylinders, or blocks; again, also considered "interposer pieces" in the present context In this latter case, the metallic pieces may be positioned (e.g., utilizing a fixture or pick-and-place tool) and bonded in place prior to the below-described overmolding of PAM 12 and the formation of overmold body 28. The overmold material may be deposited to excess thickness and the overburden may then be removed utilizing a suitable thinning process (e.g., back-gridding) to reveal the outer or upper terminal ends of the metallic pieces. Field trapper patches 18 may then be formed in contact with or, if previously fabricated, positioned over and electrically bonded to the exposed terminals surfaces of the discretely-placed metallic pieces to yield field trapper structure 14.

Figure 6:
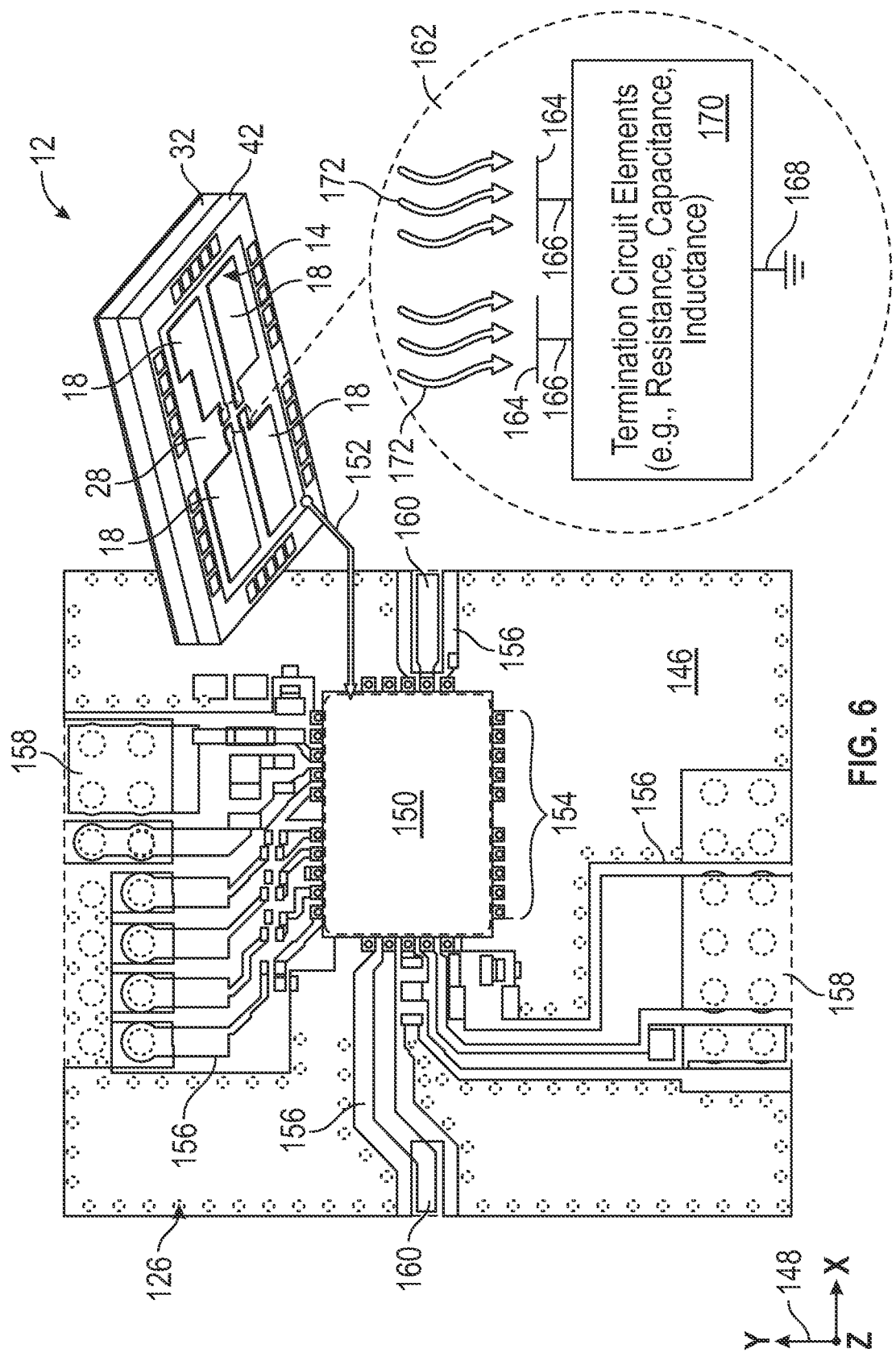
FIG. 6 schematically illustrates one manner in which the PAM shown in FIGS. 1-5 may be mounted to a system-level printed circuit board (PCB) to yield a power amplifier system, with the PAM mounted in an inverted orientation positioning the field trapper patch array vertically adjacent the PCB module mount interface.

Turning now to FIG. 6, there is shown a system-level substrate or PCB 126 to which PAM 12 is suitably mounted to yield a power amplifier system, as illustrated in accordance with an example embodiment of the present disclosure. System-level PCB 126 includes a first principal surface or frontside 146 and a second principal surface or backside (hidden from view), which are opposed in a thickness or vertical direction (corresponding to the Z-axis of coordinate legend 148). In the illustrated example in which PAM 12 is imparted with an HTP architecture including a topside I/O interface, as previously described, PAM 12 is attached to a module mount region 150 of PCB 126 in an inverted orientation, as generally indicated by arrow 152. When so mounted, PAM 12 may be physically attached to module mount region 150 utilizing any suitable bonding material providing electrical connection between the topside terminals of PAM 12 and the corresponding contacts or bondpads 154 of PCB 126. A non-exhaustive list of such bonding materials includes solder, sintered materials, and electrically-conductive die attach materials, such as metal particle-containing epoxies. Various routing features 156 (e.g., patterned Cu traces or interconnect lines) extend along PCB frontside 146 to interconnect PCB bondpads 154 with RF I/O contact regions 158 (located adjacent a first set of opposing edge regions of PCB 126) and pin terminal contact regions 160 (located adjacent a second set of opposing edge regions of PCB 126), which provide connection to other, non-illustrated electrical connectors (e.g., coaxial and pin connectors) within the larger power amplifier system.

PAM 12 is mounted or attached to frontside 146 of PCB 126 in an inverted orientation in the illustrated example such that PAM topside surface 20 is positioned adjacent and faces module mount region 150. FTP array 18 is consequently positioned between the circuitry contained within PAM 12 and module mount region 150, thus serving as a wall or shield blocking EM cross-coupling between electrically-conductive elements within PAM 12 located near module mount region 150. Such elements may include EM radiative elements located within PAM 12, which may be prone to EM interference or undesired cross-coupling during power amplifier system operation. Examples of such EM radiative elements include certain SMDs, which may be mounted to die support surface 33 of module substrate 32, as well as sets or arrays of wire bonds interconnecting different power amplifier dies and routing features of PAM 12. With respect to wire bonds, in particular, such wire bonds may be inherently prone to radiative emissions and undesired EM coupling due to their composition, lengths, and proximity to PCB 126 when PAM 12 is attached to module mount region 150 of PCB 126. Given the inverted or flipped orientation of PAM 12, the peak loop heights or apexes of the wire bonds within PAM 12 may extend toward and ultimately come into relatively close proximity to PAM topside surface 20, as measured in a thickness direction (corresponding to the Z-axis of coordinate legend 148). For this reason, FTP array 18 is advantageously patterned to include regions positioned between EM radiating elements contained within PAM 12 and module mount region 150, as taken in a thickness or vertical direction. With respect to the wire bonds, in particular, such wire bonds may be largely, if not entirely shielded by underlying portions of field trapper patches 18, as taken at the respective apexes or loop heights of the wire bonds.

While FTP array 18 may be left electrically floating in certain instances, the effectiveness of field trapper structure 14 in reducing or eliminating undesired EM cross-coupling between PAM 12 and system-level PCB 126 will typically be maximized when the field trapper patches within FTP array 18 are electrically coupled to termination circuitry and/or electrically grounded. Consider, in this regard, detail bubble 162 shown in the lower right region of FIG. 6. Here, symbols 164, 166 are representative of the field trapper patches contained in FTP array 18 and electrically-conductive interposer vias 138, respectively, while symbol 168 is representative of a ground connection, such as a connection to a ground plane within PAM 12, such as internal ground plane layer 70 shown in FIG. 3. As can be seen, termination circuitry 170 is electrically coupled between field trapper patches 164 and ground 168, with termination circuitry 170 containing any circuit element or combination of circuit elements suitable for dissipating EM energy incident upon FTP array 18 during operation of PAM 12 and the larger power amplifier system. Such circuitry can include, for example, resistors for aiding in EM energy dissipation and/or inductors tuned to target reflect energy at a particular frequency range at an appropriate phase shift to cancel-out or otherwise reduce EM energy collected onto FTP array 18. Termination circuit elements 170 may include capacitors in embodiments to, for example, provide a grounded capacitor structure in combination with ground 168. Additionally or alternatively, in embodiments, termination circuitry may include a resonant inductor/capacitor (LC) circuit, with an inductive element electrically coupled to ground (or another reference voltage) through a capacitive element (thus providing a shunt capacitance). By varying the respective inductance and capacitance values of the inductive element and the capacitive element, the input harmonic termination circuit can be tuned to resonate at a targeted harmonic frequency (e.g., 2fo) in order to terminate the signal energy collected onto FTP array 18 at the targeted harmonic frequency.

As recently noted, termination circuitry 170 may be integrated into PAM 12 and electrically coupled to the field trapper patches contained in FTP array 18 by, for example, electrically-conductive vias extending within PAM 12 in a thickness or vertical direction away from the PAM topside surface on which I/O interface 24 is provided. Such electrically-conductive vias are conveniently provided in the form of one or more interposer pieces. In the illustrated example, specifically, electrically-conductive vias are contained in central interposer piece 16, which is bonded to die support surface 33 of module substrate 32 and extends therefrom toward frontside surface 26 of PAM 12. When provided, circuit elements making-up termination circuitry 170, such as resistors or capacitors, can be integrated into central interposer piece 16 or into module substrate 32 itself. Additionally, such circuit elements may be provided utilizing discrete components contained within PAM 12, such as one or more SMDs (e.g., discrete resistors or capacitors) mounted to die support surface 33 of module substrate 32 and electrically coupled to FTP array 18 through central interposer piece 16. In alternative embodiments, certain circuit elements included within termination circuitry 170 may be integrated into FTP array 18 itself by spacing the field trapper patches to form capacitances between neighboring patches or by patterning one or more field trapper patches to form spiral inductors, as described more fully below in connection with FIG. 8.

Through the provision of field trapper structure 14, FTP array 18 may serve as a shield for reducing the transmission of EM energy from system-level PCB 126 to the circuitry contained within PAM 12 or, conversely, from PAM 12 to PCB 126. This, in combination with the vertical standoff provided by the interposer ring 42, may effectively contain or trap EM emissions within PAM 12 to minimize shifts in RF circuit performance of PAM 12, such as impedance scattering and drift. Consequently, the RF circuit performance of PAM 12 may be rendered increasingly consistent when utilized with system-level PCBs of varying designs and board material properties. Concurrently, as shown in FIGS. 1 and 3, FTP array 18 may be positioned between the RF input of PAM 12 (topside terminal 76) and the RF output of PAM 12 (topside terminal 78) to provide additional shielding reducing undesired input-output coupling. Further, the provision of FTP array 18 may have nominal impact on other electrical performance aspects of PAM 12; noting again that FTP array 18 may be patterned to avoid underlying certain circuit elements (e.g., RF transmission lines included in matching networks), which may otherwise be vulnerable to potential negative interactions with FTP array 18 absent such a spatial standoff. By mounting PAM 12 to PCB 126 in an inverted orientation, the backside thermal interface (here, backmetal layer 30) of PAM 12 is availed for thermal coupling to a non-illustrated system-level heatsink, such as a pin-fin array or a metal chassis, utilizing a thermally-conductive bonding material. Excess heat generated within the interior of PAM 12 due to the operation of the packaged IC dies (e.g., the carrier die or dies) can be efficiently conducted from the packaged dies, through module substrate 32 (e.g., due to the provision of thermal dissipation structures 46 shown in FIG. 4), through backmetal layer 30, and ultimately to the system-level heatsink for dissipation to the surrounding environment Such advantages notwithstanding FTP array 18 and field trapper structure 14, generally, can be integrated into a PAM having a more traditional, non-HTP architecture in alternative embodiments designed for mounting to a system-level substrate, such as PCB 126, in a non-inverted orientation.

Additional Examples of PAMs Including Integrated Field Trapper Structures

There has thus been described an example embodiment of a PAM having an integrated field trapper structure, which includes an array of field trapper patches distributed along or adjacent the topside surface of the PAM. In the above-described example, the PAM is imparted with a HTP architecture having a topside I/O interface, which includes multiple rows of bondpads or other terminals flanking the edges or sides of the FTP array. The above-described FTP array contained a total of four field trapper patches arranged in a two-by-two grid layout and bonded to the outermost surface of an overmold body, with such field trapper patches occupying a central portion of PAM topside surface. In further implementations of a PAM containing an integrated field trapper structure, the FTP array may be produced to include a different number of patches having another spatial arrangements. Additionally, in embodiments in which the PAM is produced as an overmolded or encapsulated module/package, the field trapper patches within the FTP array may be at least partially embedded within or, perhaps, buried below the outermost portion of the PAM overmold body. An example of a PAM including field trapper plates at least partly embedded within an overmold body will now be described in connection with FIG. 7.

Figure 7:
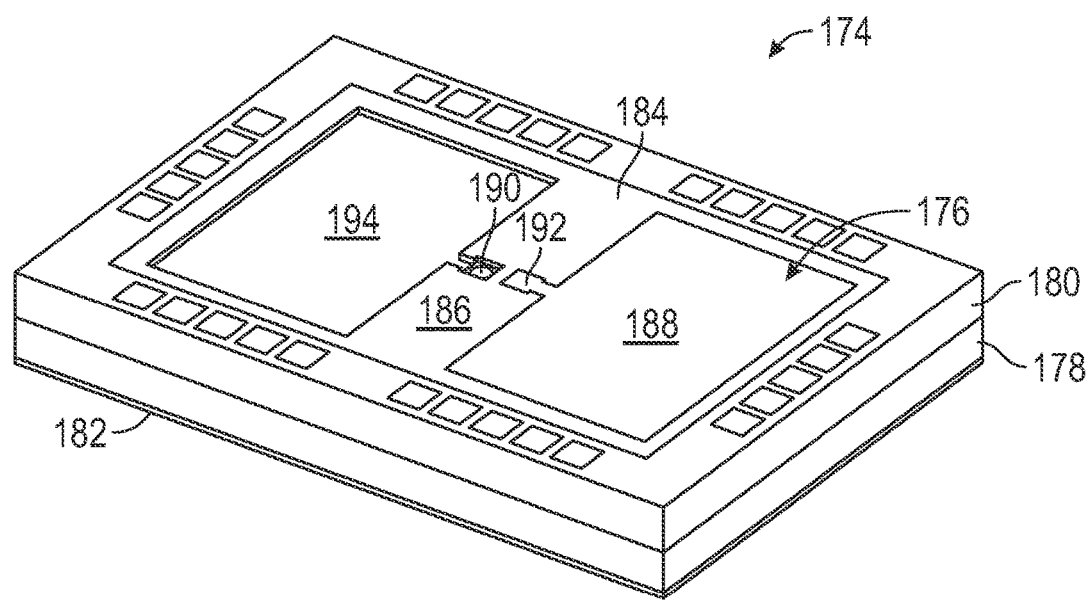
FIG. 7 is an isometric cutaway view of a PAM including a field trapper structure, which is depicted in accordance with a further example embodiment in which the field trapper patch array is embedded within an outermost portion of an encapsulant body.

Referring to FIG. 7, an example PAM 174 containing an integrated field trapper structure 176 is illustrated in accordance with a further example embodiment of the present disclosure. In many respects, PAM 174 is similar to PAM 12 described above in connection with FIGS. 1-6. For example, as does PAM 12, PAM 174 includes a module substrate 178 to which a ring-shaped interposer ring 180 is bonded. A number of frontside terminals (bondpads) is formed on interposer ring 180 to define the topside I/O interface of PAM 174. Opposite the topside I/O interface, PAM 174 further includes a backmetal layer 182, which serves as a thermal interface of PAM 174 for extracting excess heat from the interior of PAM 174. Circuitry within PAM 174, which may include one or more power amplifier dies as previously described, is encapsulated by an overmold body 184. The outermost surface of overmold body 184 helps defines a PAM topside surface 186 along which the topside I/O interface is accessible. As was previously the case, field trapper structure 176 of PAM 174 includes an array of field trapper plates or patches 188. In this case, however, FTP array 188 consists of two relatively large or expansive field trapper plates arranged in a single row and composed of an electrically-conductive material. The leftmost field trapper patch is hidden from view in FIG. 7 to reveal an interposer piece 190, which is further embedded in overmold body 184 and which contains electrically-conductive vias interconnecting the field trapper plates with corresponding electrical routing features provided on the frontside of module substrate 178. Accordingly, each field trapper plate or patch within FTP array 188 is formed to include an extension 192, which is electrically coupled to electrically-conductive features within or on module substrate 178 by way of electrically-conductive interposer vias to provide a connection to termination circuitry analogous to that described above in connection with FIG. 6.

The field trapper patches contained in FTP array 188 are embedded in overmold body 184 and may occupy open cavities or recesses 194 formed in an outer or upper portion of overmold body 184. Recesses 194 may be initially formed in overmold body 184, with the field trapper patches then inserted into recesses 194 after formation of overmold body 184 utilizing a pick-and-placement tool or a specialized fixture. In this case, an electrically-conductive bonding material, such as a solder material, a sinter precursor material, or an electrically-conductive die attach material (e.g., a metal particle-containing epoxy) may be deposited onto the outer bondpads of interposer piece 190 prior to positioning of the field trapper patches to complete the desired electrical connections with the termination circuitry contained within PAM 174. In other instances, overmold body 184 may be initially formed to include recesses 194, which may be subsequently backfilled with an electrically-conductive material to produce the field trapper patches within array 188. For example, in one manufacturing approach, a metal particle-containing material may be deposited into recesses 194 in a wet or powdered state (e.g., utilizing a fine needle dispense tool) and subsequently subjected to thermal processing (e.g., via low temperature sintering) to yield the field trapper patches electrically coupled to corresponding features of module substrate 178 through interposer piece 190. In still other instances, the field trapper patches of FTP array 188 may be independently produced and then inlaid into overmold body 184 utilizing an insert molding process, such as a transfer mold process. In this latter instance, the field trapper plates of FTP array 188 may be dimensioned to provide sufficient openings are provided to allow the flow of mold material and complete filling of the desired area without voiding. This may also be accomplished by replacing interposer ring 180 with multiple block-shaped interposer pieces in alternative embodiments of PAM 174.

Figure 8:
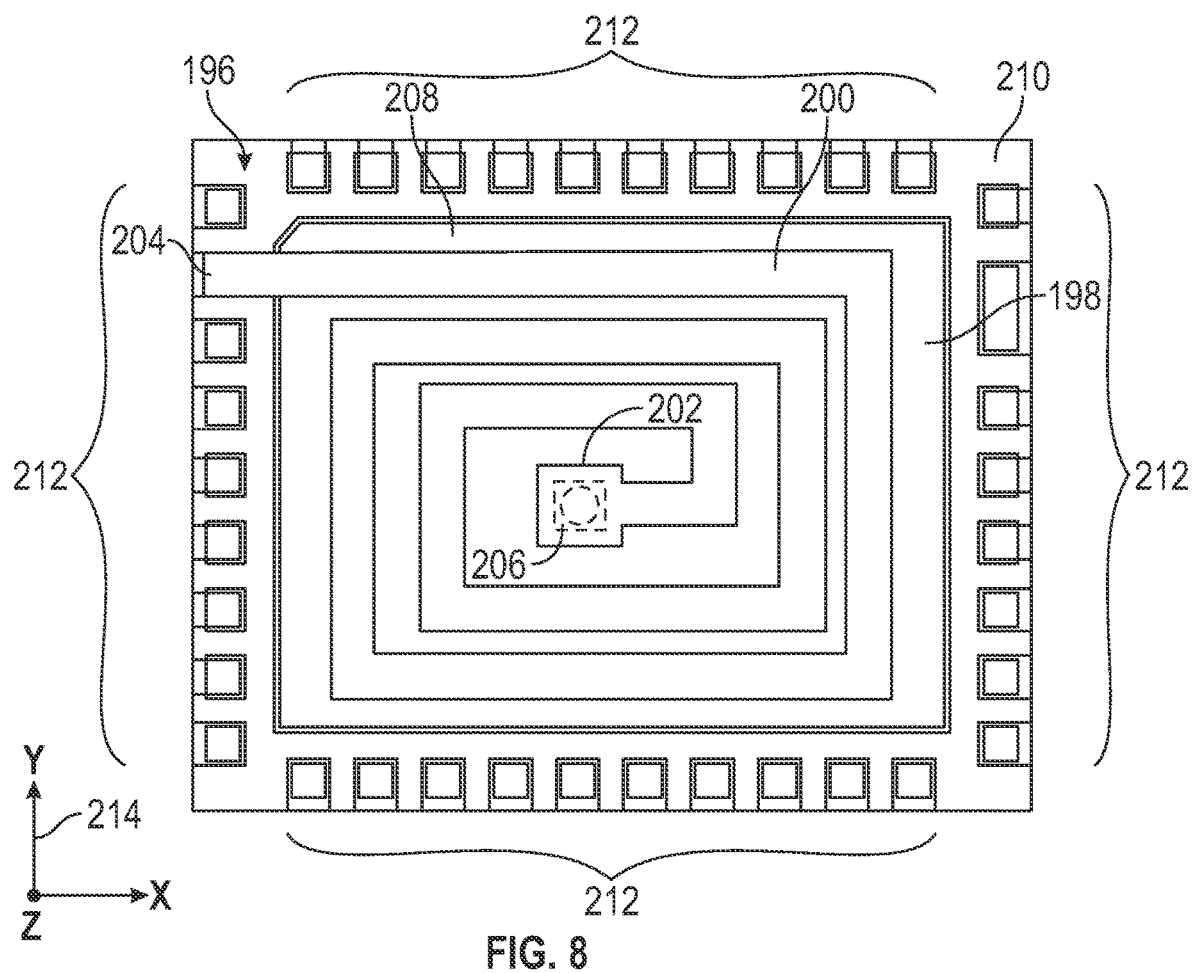
FIG. 8 is a top-down or planform view of an example PAM including a field trapper structure having a single field trapper patch patterned to define a spiral inductor, as illustrated in accordance with a further example embodiment of the present disclosure.

Progressing next to FIG. 8, an example PAM 196 including a field trapper structure 198, illustrated in accordance with a further example embodiment of the present disclosure. In this example, field trapper structure 198 includes a single field trapper patch 200, which extends over the central region of the PAM topside surface on which a topside I/O interface 212 is provided. Once again, PAM 196 includes a ring-shaped interposer piece 210, which extends around an overmold body 208 encapsulating power amplifier dies and other circuitry contained within PAM 196. Field trapper patch 200 is patterned to define a spiral inductor having an innermost end portion 202 and an outer end portion 204. During manufacture of PAM 196, field trapper patch 200 may be independently fabricated and bonded onto the outermost surface of overmold body 208 as shown, whether field trapper patch 200 is provided as adhesive patterned foil, in a thicker leadframe format, or in another manner. In other instances, field trapper patch 200 may be directly deposited onto the outermost surface of overmold body 208 or the topside of PAM 196 utilizing, for example, a sputter deposition process. In either instance, innermost portion 202 of field trapper patch 200 may be placed in electrical contact with an interposer piece 206 containing an electrically-conductive via extending in a thickness direction (corresponding to the Z-axis of coordinate legend 214) to provide an electrical connection to the module substrate and termination circuitry contained within PAM 196 as previously described; e.g., the spiral inductor defined in field trapper patch 200 may be placed in series or in parallel with a non-illustrated capacitor contained in PAM 196 to form an LC circuit for dissipating energy collected onto field trapper patch 200. Comparatively, outermost portion 204 of field trapper patch 200 extends onto an interposer ring 210 to contact one of the bondpads or terminals included in topside I/O interface 212.

In the above-described manner, a two terminal spiral inductor is thus formed, which may be tuned by design to absorb EM energy at a targeted frequency to terminate stray EM energy radiated by conductive elements within PAM 196 at this frequency. Field trapper patch 200, potentially in combination with other circuit elements within PAM 196 (e.g., capacitive elements and a ground plane layer), may therefore provide the desired EM trapping or shielding effect, desensitizing PAM performance to variations in the materials and layout of system-level PCBs to which PAM 196 is ultimately mounted. In other implementations, field trapper structure 198 may include multiple field trapper patches having spiral-shaped geometries or other fine pitch shapes, which are adapted to provide optimal shielding of wire bonds or other radiative elements contained within PAM 196. Additionally, when formed to define a spiral inductor, other embodiments of the field trapper patch or patches contained within a field trapper structure can have other planform geometries aside from square spiral geometries including, for example, circular or octagonal planform geometries and multipath inductor shapes.

Power Amplifier System and Power Amplifier Module Having an Integrated Field Trapper Structure In further implementations of the power amplifier system, a field trapper structure may be integrated into the system-level PCB, such as a motherboard, to which a PAM is mounted; or, perhaps, the field trapper structure may be partially or wholly implemented utilizing an intervening structure (e.g., a daughterboard) electrically-interconnected and positioned vertically between a PAM and a system-level PCB. For example, in other realizations, a given field trapper structure may include an FTP array defined by patterning of the uppermost or frontside metal layer included in the system-level PCB, with the field trapper patches of the FTP array distributed across a central portion of a module mount region to which a PAM is attached. Considering, in this regard, system-level PCB 220 further shown in FIGS. 9 and 10. In this example, a field trapper structure 246 is integrated into system-level PCB 220 and includes, among other features, an FTP array 248 distributed within a central portion of module mount region 234 of PCB 220. More generally, PCB 220 includes a first principal surface or frontside 226 and a second principal surface or backside 228, which are opposed in a thickness direction (corresponding to the Z-axis of coordinate legend 230). In the illustrated example in which PAM 222 is imparted with an HTP architecture including a topside I/O interface 232 (identified in FIG. 9), PAM 222 is attached to a module mount region 234 of PCB 220 in an inverted orientation, as generally indicated by arrow 236 in FIG. 9 and as shown in the cross-section of FIG. 10. When so mounted, PAM 222 may be physically attached to module mount region 234 utilizing any suitable bonding material providing electrical connection between the topside terminals of PAM 222 and the corresponding contacts or bondpads of PCB 220. A non-exhaustive list of such bonding materials includes solder, sintered materials, and electrically-conductive die attach materials, such as metal particle-containing epoxies. Routing features 238 (e.g., patterned Cu traces or interconnect lines) extend along PCB frontside 226 to interconnect PCB bondpads 240 with RF I/O contact regions 242 (located adjacent a first set of opposing edge regions of PCB 220) and pin terminal contact regions 244 (located adjacent a second set of opposing edge regions of PCB 220), which provide connection to other, non-illustrated electrical connectors (e.g., coaxial and pin connectors) within the larger power amplifier system.

PAM 222 is mounted or attached to frontside 226 of PCB 220 in an inverted orientation in the illustrated example in which PAM 222 is imparted with an HTP architecture. Due to this inverted mounting PAM topside surface 254 is positioned adjacent and faces module mount region 234 in which FTP array 248 is formed. When PAM 222 is properly mounted to PCB frontside 226, at least one RF input terminal and at least one RF output terminal included in topside I/O terminals 256 of PAM 222 are electrically coupled to corresponding terminals or bondpads located on PCB frontside 226; namely, an RF input bondpad 258 and an RF output bondpad 260, which are included in bondpad rows 240 flaking different (e.g., opposing) edges of FTP array 248. PAM 222 is consequently positioned over and vertically adjacent FTP array 248, and may be substantially concentric with FTP array 248 in embodiments. Additionally, PAM topside surface 254 may cover FTP array 248, in whole or in part, as viewed looking downwardly on PCB 220 along centerline 262 after attachment of PAM 222 to module mount region 234. The field trapper patches included in FTP array 248 are formed in a common metal layer of PCB 220, such as the uppermost patterned metal layer 250 of PCB 220 (identified in FIG. 10). In other implementations, FTP array 248 may be formed in an internal level in PCB 220, such as in the next patterned metal layer beneath the uppermost patterned metal layer 250 and above the lowermost metal layer 252 of PCB 220, while having a planform or horizontal positioning identical or similar to that shown in FIGS. 9 and 10. In such instances, FTP array 248 is considered to be located vertically-adjacent module mount region 234 of PCB 220 and may be located closer to frontside 226 of PCB 220 than to the backside thereof, as taken in a vertical or thickness direction (again, corresponding to the Z-axis of coordinate legend 230).

As was previously the case, the field trapper patches of FTP array 248 are imparted with substantially rectangular planform geometries in the present example. In other instances, the field trapper patches of FTP array 248 may be imparted with other planform geometries as tailored to best suit the EM shielding demands of a particular application given, for example, the circuitry layout of PCB 220 and PAM 222, as well as the radiofrequency range over which PAM 222 is configured to operate. Additionally, the field trapper patches of FTP array 248 are again spaced along a common plane extending parallel to module mount region 234 (corresponding to the X-Y of coordinate legend 230) in a grid array. In other instances, FTP array 248 may include a greater or lesser number of field trapper patches, which may be imparted with more complex planform geometries or arranged in other spatial distributions. For example, in alternative realizations, FTP array 248 may include field trapper patches formed in two or more patterned layers of PCB 220 (e.g., the uppermost patterned metal layer of PCB 220 and an internal patterned metal layer located adjacent the uppermost patterned metal layer); and, thus, distributed along multiple, vertically-spaced planes to yield a three dimensional structure of varying complexities.

Figure 9:
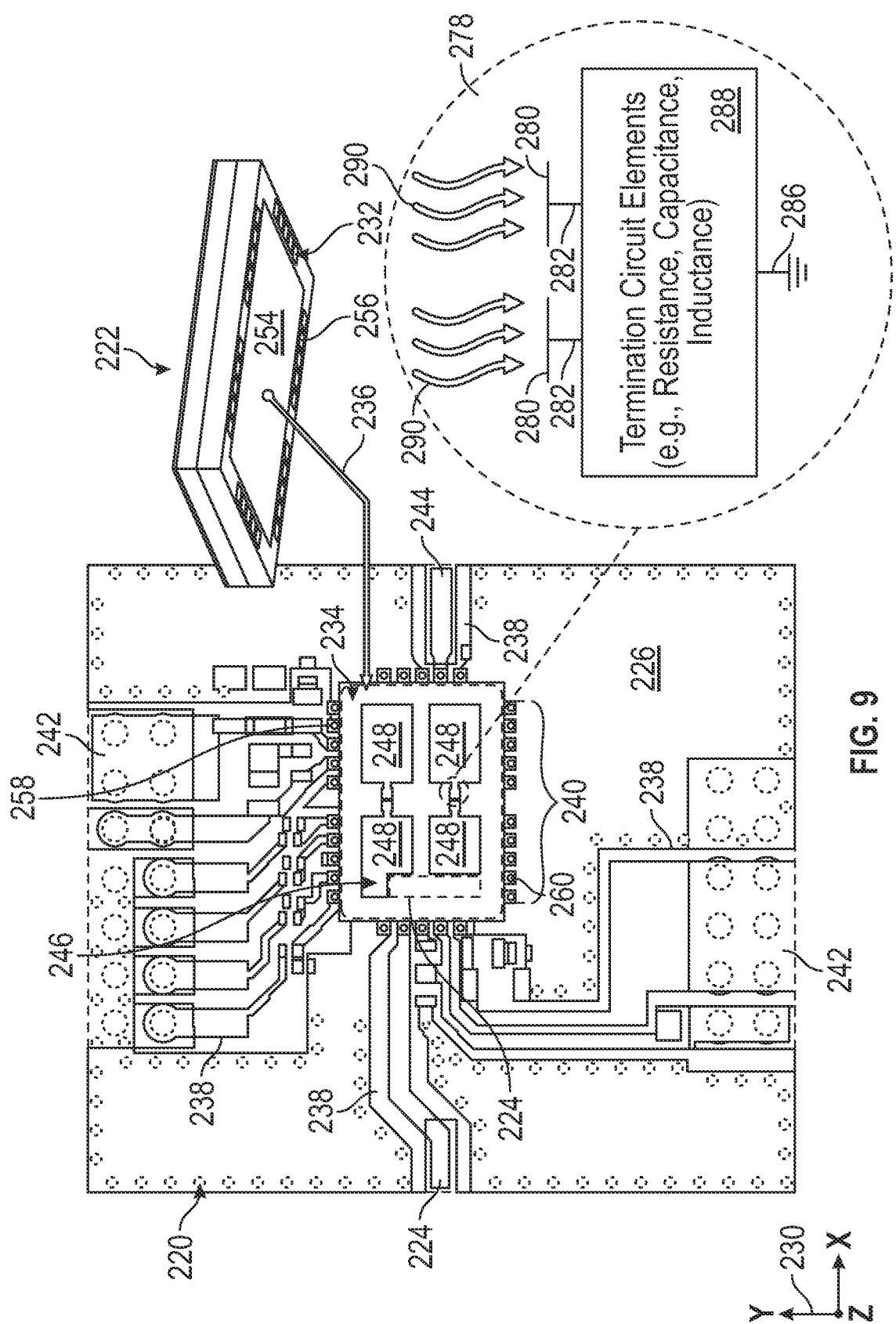
FIG. 9 is a top-down or planform view of a system-level PCB having a module mount region to which a PAM may be mounted to yield a power amplifier system, as illustrated in an accordance with a further example embodiment in which a field trapper structure is integrated into the PCB in addition to or in lieu of a PAM-integrated field trapper structure.
Figure 10:
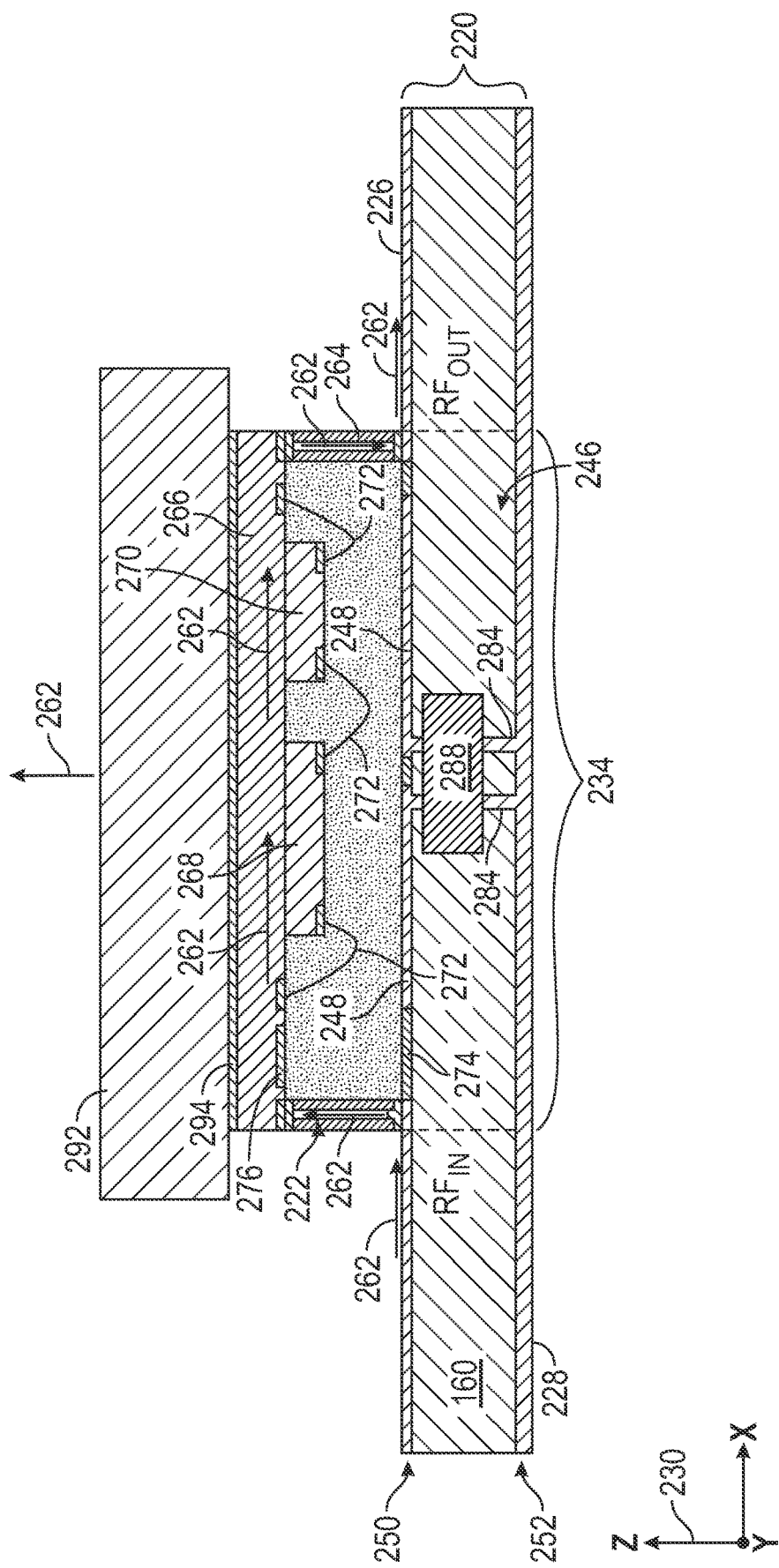
FIG. 10 is a cross-sectional schematic of the PCB, the PAM, and a heatsink included in the power amplifier system shown in FIG. 9, which further illustrates one manner in which the PAM may be mounted to the PCB in an inverted orientation such that the PAM topside surface is positioned adjacent the field trapper patch array of the PCB-integrated field trapper structure.

As shown most clearly in FIG. 9, RF input bondpad 258 and RF output bondpad 260 are contained within opposing PCB bondpad I/O rows, which are located adjacent and flank different sides (e.g., adjacent or opposing sides) of FTP array 248. Due to this spatial configuration, RF signals transmitted through PAM 222 may be conducted along the following general signal transmission path or paths, as indicated by arrow 262 in FIG. 10. First, an RF signal (e.g., an amplified RF signal not yet split into carrier and peaking fractions) may be received at an RF input terminal of PAM 222 (analogous to RF input terminal 76 of PAM 12 shown in FIG. 1) and be conducted through a first interposer via formed in an interposer ring 264 in a direction away from PCB 220 and toward a module substrate 266, as indicated on the left side of FIG. 10. The RF signal may then be transmitted through amplifier dies 268, 270, thus undergoing signal amplification and traveling over grounded FTP array 248 as viewed along a section plane orthogonal to array 248. Following this, the newly-amplified RF signal is transmitted through the second interposer via formed in interposer ring in a direction away from module substrate 266 and toward system-level PCB 220 to the RF output terminal of PAM 222 (analogous to RF output terminal 78 of PAM 12 shown in FIG. 1). Accordingly, viewing PAM 222 and system-level PCB 220 from the cross-section of FIG. 10, the RF signal is effectively transmitted up and over FTP array 248 formed in the uppermost patterned metal layer 250 of PCB 220 and located within module mount region 234. Additionally, wire bonds 272 within PAM 222 (when present) may project in a direction away from module substrate 266 and the packed dies, with the respective loop apexes of the wire bonds extending toward FTP array 248. FTP array 248 may consequently further assist in blocking undesired EM energy radiated from the wire bonds in embodiments depending upon, for example, the proximity between the wire bond apexes and FTP array 248. Concurrently, certain areas of FTP array 248 may be patterned to include openings or non-metallized regions to terminate prior to encroachment over other electrically-conductive features of PAM 222. This is indicated in FIG. 9 by dashed region 274, which may underlie a transmission line 276 included in an input-side impedance matching network or the like (shown in FIG. 10), as taken along an axis orthogonal to PCB frontside 226 (extending parallel to the thickness direction).

As described in detail above in connection with field trapper structure 14 of PAM 12, the effectiveness of field trapper structure 246 in reducing or eliminating undesired EM cross-coupling may be optimized by connecting each of the field trapper patches within FTP array 248 to termination circuitry contained in or mounted to system-level PCB 220. This is schematically denoted in FIG. 9 by a detail bubble 278, in which symbols 280, 282 are representative of the field trapper patches within FTP array 248 and electrically-conductive vias 284, respectively; symbol 286 is representative of a ground connection, such as a connection to a ground plane within PAM 222. As indicated, termination circuitry 288 is electrically coupled between the field trapper patches (symbols) 280 and ground 286. Such circuitry can include, for example, capacitors and resistors for aiding in EM energy dissipation to a ground plane within PCB 220 and/or inductors tuned to target reflect energy at a particular frequency range at an appropriate phase shift to cancel-out EM energy collected onto FTP array 248. In certain cases, termination circuitry 288 may form include a resonant LC circuit, with an inductive element electrically coupled to ground through a capacitive element Generally, then, termination circuitry 288 can contain any circuit element or combination of circuit elements suitable for dissipating EM energy incident upon FTP array 248 during operation of the power amplifier system and may be tuned to shunt energy collected onto FTP array 248 to ground 286 at a particular targeted frequency or frequency range corresponding to the operational frequency range of PAM 222 in embodiments of the present disclosure.

In the above-described manner, integration of field trapper structure 246 into system-level PCB 220 may eliminate undesired EM coupling within the power amplifier system. Further, FTP array 248 provides relatively comprehensive or widespread shielding between the RF input (or inputs) and RF output (or outputs) of PCB 220 to reduce, if not eliminate input-output coupling at the PAM-PCB interface. In this regard, the field trapper patches of FTP array 248 may collectively occupy a majority of the central portion of module mount region 234 bordered or flanked by PCB bondpads 240. FTP array 248 may further help eliminate any input-output coupling between RF bondpads 258, 260 as FTP array 248 is positioned between the opposing bondpad row containing bondpads 258, 260. Field trapper structure 246 can be readily integrated into system-level PCB 220 at minimal cost and modification through conventional PCB fabrication and metal layer pattering techniques; noting that, in many conventional PCB designs, the central portion of the module mount is commonly left as an unused space lacking electrical routing features or is otherwise simply covered by a continuous ground plane. As a still further advantage, the presently-disclosed field trapper structures are well-suited for usage within PAMs having HTP architectures enhancing PAM electrical and thermal performance. In this regard, and referring briefly once again to FIG. 10, PAM 222 may be mounted to PCB 220 in an inverted or flipped orientation to avail the backside thermal interface of PAM 222 (here, backmetal layer 294) for thermal coupling to a system-level heatsink 292, such as a pin-fin array or a metal chassis, utilizing a thermally-conductive bonding material. Excess heat generated within the interior of PAM 222 due to the operation of the packaged IC dies (e.g., the carrier die or dies) can be efficiently conducted from the packaged dies, through module substrate 266, through backmetal layer 294, and ultimately to system-level heatsink 292 for dissipation to the surrounding environment.

CONCLUSION

There has thus been disclosed PAMs, system-level PCBs, and power amplifier systems containing unique field trapper structures. Depending upon the particular manner in which the power amplifier system is implemented, a given field trapper structure may be integrated into a system-level PCB, into a PAM mounted to the system-level PCB, or a combination thereof. In either case, the field trapper structure may include one or more field trapper patches, which extend parallel to the PCB frontside and which are located within or vertically adjacent the module mount region in the thickness direction when, for example, a PAM is mounted to the PCB in an inverted orientation. The field trapper structure may further include termination circuitry in at least some embodiments, with the termination circuitry electrically coupled to the field trapper patch or patches and configured to dissipate EM energy impinging the field trapper patches during operation of the power amplifier system. In this manner, the field trapper structures reduce the susceptibility of the system to undesired EM interactions that may otherwise occur across the interface between the PAM and the system-level PCB, in essence trapping EM fields within the PAM or within the vicinity of the PCB. This, in turn, may reduce or eliminate shifts in RF circuit performance otherwise potentially occur due to interactions (e.g., impedance scattering and drift) between radiative elements within a PAM and the system-level PCB. Further, the field trapper structure may also provide shielding between electrically-conductive structures contained within the PCB or PAM itself; e.g., embodiments of the field trapper structure may provide shielding between RF input and output terminals of the PAM, and/or between the corresponding RF input and output bondpads of the PCB, to block undesired input-output coupling within the power amplifier system.

Embodiments of the power amplifier system includes a PCB, a PAM, and a field trapper structure. The PAM includes, in turn, a topside RF input terminal, topside RF output terminal, a PAM topside surface on which the topside RF input terminal and the topside RF output terminal are located. The PAM is mounted to the PCB in an inverted orientation such that the PAM topside surface is positioned adjacent and faces a module mount region provided on a frontside of the PCB. The field trapper structure includes a first field trapper patch, which extends parallel to the PCB frontside, is composed of an electrically-conductive material (e.g., a metallic material), and is located within or adjacent the module mount region in the thickness direction. In certain embodiments, the power amplifier system further includes an electrically-conductive (e.g., interposer) via extending from the first field trapper patch in the thickness direction, as well as termination circuitry electrically coupled to the first field trapper patch through the electrically-conductive via. The termination circuitry is configured to dissipate EM energy impinging or incident upon the first field trapper patch during operation of the power amplifier system. Additionally, in at least some instances, the power amplifier system further includes a ground plane, which is contained in either the PCB or in the PAM and which is electrically coupled to the first field trapper patch through the termination circuitry. For example, in an embodiment in which the ground plane is contained in the PAM, the PAM may further include a module substrate (e.g., a PCB or a leadframe-based substrate) and an interposer piece bonded to the module substrate, containing the electrically-conductive via, and extending toward and possibly the PAM topside surface in the thickness direction. In still other embodiments, the field trapper structure may include FTP array distributed along a plane parallel to the module mount region, with termination circuitry (e.g., including a plurality of resistors and/or capacitors) electrically coupled to field trapper patches included in the FTP array and configured to EM energy impinging the FTP array during operation of the power amplifier system.

Continuing the foregoing paragraph, embodiments of the PAM may also include a module substrate and radiating elements located within the PAM between the module substrate and the PAM topside surface. In such embodiments, the field trapper patch array may be patterned to include patch regions positioned between the radiating elements and a region of the PCB beneath the module mount region, as taken in the thickness direction. For example, in certain embodiments in which the PAM includes a module substrate and wire bonds having peak loop portions or apex regions extending away from the module substrate and toward the PAM topside surface, the field trapper patch array may be patterned to include metallic regions underlying the peak loop portions of the wire bonds, as taken in the thickness direction. Additionally or alternatively, embodiments of the PAM may contain an RF network (e.g., an impedance matching network) including an RF network component (e.g., an SMD, a wire bond, or an RF-signal transmission line), with the field trapper patch array patterned to terminate prior to encroachment over the RF network component, as taken in the thickness direction. Finally, in certain implementations of the power amplifier system, the PCB may include: (i) a first row of bondpads located on a periphery of the module mount region, flanking a first side of the field trapper patch array, and containing an RF input bondpad electrically coupled to the topside RF input terminal of the PAM; and (ii) a second row of bondpads further located on the periphery of the module mount region, flanking a second side of the field trapper patch array, and containing an RF output bondpad electrically coupled to the topside RF output terminal of the PAM.

Embodiments of a PCB utilized within a power amplifier system have also been provided. In an embodiment, the PCB includes a PCB frontside on which a module mount region is provided for attachment of a power amplifier module; a PCB backside located opposite the PCB frontside, as taken in a thickness direction, an RF input bondpad located on the PCB frontside and within an outer peripheral portion of the module mount region, an RF output bondpad located on the PCB frontside and within an outer peripheral portion of the module mount region, and a field trapper structure. The field trapper structure includes, in turn, a field trapper patch array located within a central portion of the module mount region, as well as termination circuitry electrically coupled to field trapper patches included in the field trapper patch array. The termination circuitry is configured to dissipate electromagnetic energy impinging the field trapper patch array during operation of the power amplifier system. Further, in at least some implementations, the field trapper patch array is located between the RF input bondpad and the RF output bondpad, as taken along an axis perpendicular to the thickness direction.

Embodiments of a PAM utilized within a power amplifier system have further been disclosed. In an embodiment, the PAM includes a power amplifier die, a module substrate having a die support surface to which the power amplifier die is attached, a PAM body enclosing the power amplifier die (e.g., an overmold body encapsulating the power amplifier die) and at least partially defining a PAM topside surface, and topside input/output (I/O) interface formed on the PAM topside surface. The PAM further includes a field trapper structure containing: (i) a field trapper patch array located on or adjacent the PAM topside surface; and (ii) termination circuitry electrically coupled to field trapper patches included in the field trapper patch array and configured to dissipate electromagnetic energy impinging the field trapper patch array during operation of the power amplifier system. IN certain embodiments in which the field trapper structure also contains an impedance matching network including a transmission line, the field trapper patch array is patterned to terminate prior to encroaching over the transmission line taken in a thickness direction.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A power amplifier system, comprising:
  a printed circuit board (PCB), comprising:
    a PCB frontside on which a module mount region is provided; and
    a PCB backside opposite the PCB frontside in a thickness direction;
  a power amplifier module (PAM), comprising:
    a topside radio frequency (RF) input terminal;
    a topside RF output terminal; and
    a PAM topside surface on which the topside RF input terminal and the topside RF output terminal are located, the PAM mounted to the PCB in an inverted orientation such that the PAM topside surface is positioned adjacent and faces the module mount region; and
  a field trapper structure comprising a first field trapper patch, the first field trapper patch extending parallel to the PCB frontside, composed of an electrically-conductive material, and located within or adjacent the module mount region in the thickness direction, wherein the field trapper structure comprises a field trapper patch array that includes a first field trapper patch and a second field trapper patch distributed along a plane parallel to the module mount region, and wherein the first field trapper patch and the second field trapper patch are electrically isolated from one another within a plane of the PCB frontside;
  an electrically-conductive via extending from the first field trapper patch in the thickness direction; and
  termination circuitry electrically coupled to the first field trapper patch through the electrically-conductive via, the termination circuitry configured to dissipate electromagnetic energy impinging the first field trapper patch during operation of the power amplifier system.

2. The power amplifier system of claim 1, further comprising a ground plane contained in the PCB or the PAM, the ground plane electrically coupled to the first field trapper patch through the termination circuitry.

3. The power amplifier system of claim 2, wherein the ground plane is contained in the PAM; and
  wherein the PAM further comprises:
    a module substrate; and
    an interposer piece bonded to the module substrate, containing the electrically-conductive via, and extending to the PAM topside surface.

4. A power amplifier system, comprising:
  a printed circuit board (PCB), comprising:
    a PCB frontside on which a module mount region is provided; and
    a PCB backside opposite the PCB frontside in a thickness direction;
  a power amplifier module (PAM), comprising:
    a module substrate;
    a topside radio frequency (RF) input terminal;
    a topside RF output terminal; and
    a PAM topside surface on which the topside RF input terminal and the topside RF output terminal are located, the PAM mounted to the PCB in an inverted orientation such that the PAM topside surface is positioned adjacent and faces the module mount region;
  radiating elements located within the PAM between the module substrate and the PAM topside surface; and
  a field trapper structure comprising a field trapper patch array distributed along a plane parallel to the module mount region that includes a first field trapper patch, the first field trapper patch extending parallel to the PCB frontside, composed of an electrically-conductive material, and located within or adjacent the module mount region in the thickness direction, wherein the field trapper structure comprises a field trapper patch array distributed along a plane parallel to the module mount region, and wherein the field trapper patch array is patterned to include patch regions positioned between the radiating elements and a region of the PCB beneath the module mount region, as taken in the thickness direction.

5. The power amplifier system of claim 4, wherein the field trapper patch array comprises a plurality of field trapper patches spaced in a plane orthogonal to the thickness direction; and
  wherein the field trapper structure further comprises termination circuitry electrically coupled to each of the plurality of field trapper patches.

6. The power amplifier system of claim 4, wherein the PAM comprises
  a module substrate, wherein:
    the radiating elements include wire bonds having peak loop portions extending away from the module substrate and toward the PAM topside surface; and
    the field trapper patch array is patterned to include metallic regions underlying the peak loop portions of the wire bonds, as taken in the thickness direction.

7. The power amplifier system of claim 4, in which the PAM further comprises:
  a surface mount device (SMD) mounted to the module substrate and susceptible to electromagnetic (EM) cross-coupling with the field trapper patch array;
  wherein the field trapper patch array is patterned to terminate prior to encroachment over the SMD, as taken in the thickness direction.

8. The power amplifier system of claim 4, in which the PAM further comprises an RF network containing an RF network component; and
  wherein the field trapper patch array is patterned to terminate prior to encroachment over the RF network component, as taken in the thickness direction.

9. The power amplifier system of claim 8, wherein the RF network comprises an impedance matching network; and
  wherein the RF network component comprises a surface mount device, a wire bond, or an RF-signal transmission line contained in the impedance matching network.

10. The power amplifier system of claim 4, wherein the PAM further comprises a backside thermal interface opposite the PAM topside surface, the backside thermal interface and the field trapper patch array intersected by a common axis extending parallel to the thickness direction.

11. The power amplifier system of claim 4, wherein the field trapper patch array is formed in an upper metal layer of the PCB and distributed across a central portion of the module mount region.

12. The power amplifier system of claim 4, wherein the PCB further comprises:
a first row of bondpads located on a periphery of the module mount region, flanking a first side of the field trapper patch array, and containing an RF input bondpad electrically coupled to the topside RF input terminal of the PAM; and
a second row of bondpads further located on the periphery of the module mount region, flanking a second side of the field trapper patch array, and containing an RF output bondpad electrically coupled to the topside RF output terminal of the PAM.

13. The power amplifier system of claim 12, wherein a central portion of the module mount region is located between the first row of bondpads and the second row of bondpads; and
wherein the field trapper patch array occupies a majority of the central portion of the module mount region by surface area.

14. The power amplifier system of claim 4, wherein the field trapper structure is integrated into the PAM; and
wherein the field trapper patch array is distributed along the PAM topside surface.

15. The power amplifier system of claim 5, wherein the PAM further comprises:
a power amplifier die attached to the module substrate; and
an overmold body contacting the module substrate and encapsulating the power amplifier die, the field trapper patch array bonded to an outer portion of the overmold body opposite the module substrate.

16. A printed circuit board (PCB) utilized within a power amplifier system, the PCB comprising:
a PCB frontside on which a module mount region is provided for attachment of a power amplifier module;
a PCB backside located opposite the PCB frontside, as taken in a thickness direction;
a radio frequency (RF) input bondpad located on the PCB frontside and within an outer peripheral portion of the module mount region;
an RF output bondpad located on the PCB frontside and within an outer peripheral portion of the module mount region; and
a field trapper structure, comprising:
a field trapper patch array located within a central portion of the module mount region, wherein the field trapper patch array includes a first field trapper patch and a second field trapper patch distributed along a plane parallel to the module mount region, and wherein the first field trapper patch and the second field trapper patch are electrically isolated from one another within a plane of the PCB frontside; and
termination circuitry electrically coupled to field trapper patches included in the field trapper patch array and configured to dissipate electromagnetic energy impinging the field trapper patch array during operation of the power amplifier system.

17. A power amplifier module (PAM) utilized within a power amplifier system, the PAM comprising:
a power amplifier die;
a module substrate having a die support surface to which the power amplifier die is attached;
a PAM body enclosing the power amplifier die and at least partially defining a PAM topside surface;
topside input/output (I/O) interface formed on the PAM topside surface; and
a field trapper structure, comprising:
a field trapper patch array located on or adjacent the PAM topside surface, wherein the field trapper patch array includes a first field trapper patch and a second field trapper patch distributed along a plane parallel to a module mount region, and wherein the first field trapper patch and the second field trapper patch are electrically isolated from one another within a plane of the PAM topside surface; and
termination circuitry electrically coupled to field trapper patches included in the field trapper patch array and configured to dissipate electromagnetic energy impinging the field trapper patch array during operation of the power amplifier system.

18. The PAM of claim 17, further comprising an impedance matching network including a transmission line, the field trapper patch array patterned to terminate prior to encroaching over the transmission line taken in a thickness direction.

* * * * *